United States Patent
Shishido

(10) Patent No.: US 10,008,513 B2
(45) Date of Patent: Jun. 26, 2018

(54) SEMICONDUCTOR DEVICE

(71) Applicant: SEMICONDUCTOR ENERGY LABORATORY CO., LTD., Atsugi-shi, Kanagawa-ken (JP)

(72) Inventor: Hideaki Shishido, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days. days.

(21) Appl. No.: 14/470,965

(22) Filed: Aug. 28, 2014

(65) Prior Publication Data

US 2015/0060845 A1 Mar. 5, 2015

(30) Foreign Application Priority Data

Sep. 5, 2013 (JP) ................................. 2013-184153
May 23, 2014 (JP) ................................. 2014-107131
Jun. 30, 2014 (JP) ................................. 2014-134727

(51) Int. Cl.
*H01L 27/12* (2006.01)
*H01L 29/786* (2006.01)

(52) U.S. Cl.
CPC ...... *H01L 27/1225* (2013.01); *H01L 27/1255* (2013.01); *H01L 29/78648* (2013.01); *H01L 29/78678* (2013.01)

(58) Field of Classification Search
CPC ............ H01L 27/1225; H01L 27/1255; H01L 29/78648; H01L 29/78678; H01L 27/1288;

(Continued)

(56) References Cited

U.S. PATENT DOCUMENTS 5,731,856 A 3/1998 Kim et al.
5,744,864 A 4/1998 Cillessen et al.
(Continued)

FOREIGN PATENT DOCUMENTS

EP 1737044 A 12/2006
EP 2226847 A 9/2010
(Continued)

OTHER PUBLICATIONS

Asakuma.N. et al., "Crystallization and Reduction of Sol—Gel-Derived Zinc Oxide Films by Irradiation With Ultraviolet Lamp", Journal of Sol-Gel Science and Technology, 2003, vol. 26, pp. 181-184.

(Continued)

*Primary Examiner* — Michael Carter
*Assistant Examiner* — Mohammed R Alam
(74) *Attorney, Agent, or Firm* — Nixon Peabody LLP; Jeffrey L. Costellia

(57) ABSTRACT

A semiconductor device includes a first and a second conductive films over an insulating surface; a first insulating film over the insulating surface and the first and the second conductive films; a semiconductor film overlapping with the first conductive film with the first insulating film provided therebetween; a third conductive film in contact with the semiconductor film; a fourth conductive film in contact with the semiconductor film and overlapping with the second conductive film with the first insulating film provided therebetween; a second insulating film including a thick region and a thin region, over the semiconductor film and the third and the fourth conductive films; a fifth conductive film overlapping with the semiconductor film with the second insulating film provided therebetween; and a sixth conductive film overlapping with the fourth conductive film over the thin region of the second insulating film.

17 Claims, 31 Drawing Sheets

(58) Field of Classification Search
CPC .............. H01L 27/3265; H01L 27/3244; H01L
2227/323; H01L 27/3262; G02F
1/136286; G02F 1/1393; G02F
2001/136222; G02F 1/136209; G02F
2201/40
See application file for complete search history.

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 6,839,108 B1 | 1/2005 | Hirakata et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,602,452 B2 | 10/2009 | Kato et al. |
| 7,674,650 B2 | 3/2010 | Akimoto et al. |
| 7,732,819 B2 | 6/2010 | Akimoto et al. |
| 7,910,490 B2 | 3/2011 | Akimoto et al. |
| 7,932,521 B2 | 4/2011 | Akimoto et al. |
| 8,102,476 B2 | 1/2012 | Son et al. |
| 8,274,077 B2 | 9/2012 | Akimoto et al. |
| 8,466,463 B2 | 6/2013 | Akimoto et al. |
| 8,629,069 B2 | 1/2014 | Akimoto et al. |
| 8,669,550 B2 | 3/2014 | Akimoto et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0058097 A1* | 3/2007 | Kato ................. G02F 1/136213 349/38 |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0236640 A1 | 10/2007 | Kimura |
| 2007/0252928 A1 | 11/2007 | Ito et al. |
| 2007/0272922 A1 | 11/2007 | Kim et al. |
| 2007/0285591 A1 | 12/2007 | Moh et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0309839 A1* | 12/2008 | Kim et al. ................. 349/44 |
| 2009/0068773 A1 | 3/2009 | Lai et al. |
| 2009/0073325 A1 | 3/2009 | Kuwabara et al. |
| 2009/0096948 A1* | 4/2009 | Yokoyama et al. ............ 349/39 |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0163874 A1 | 7/2010 | Koyama et al. |
| 2011/0024750 A1* | 2/2011 | Yamazaki ............ H01L 27/1214 257/57 |
| 2011/0032435 A1 | 2/2011 | Kimura |
| 2012/0062811 A1 | 3/2012 | Miyake |
| 2012/0218485 A1 | 8/2012 | Chikama et al. |
| 2012/0319107 A1 | 12/2012 | Miyake |
| 2013/0215370 A1* | 8/2013 | Takanishi et al. ............ 349/139 |
| 2014/0034954 A1 | 2/2014 | Yamazaki et al. |
| 2014/0042432 A1 | 2/2014 | Yamazaki |
| 2014/0175432 A1 | 6/2014 | Yamazaki et al. |
| 2014/0326993 A1 | 11/2014 | Oikawa et al. |
| 2015/0179680 A1* | 6/2015 | Tsuno ..................... H05B 33/22 257/71 |

FOREIGN PATENT DOCUMENTS

| | | |
|---|---|---|
| EP | 2579237 A | 4/2013 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 11-326953 A | 11/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2003-241667 A | 8/2003 |

(56) References Cited

FOREIGN PATENT DOCUMENTS

| JP | 2004-103957 A | 4/2004 |
|---|---|---|
| JP | 2004-273614 A | 9/2004 |
| JP | 2004-273732 A | 9/2004 |
| JP | 2007-096055 A | 4/2007 |
| JP | 2007-148345 A | 6/2007 |
| JP | 2007-212812 A | 8/2007 |
| WO | WO-2004/114391 | 12/2004 |
| WO | WO-2011-148537 A1 | 12/2011 |
| WO | WO 2013187173 * | 12/2013 |

OTHER PUBLICATIONS

Asaoka.Y et al., "29.1:Polarizer-Free Reflective LCD Combined with Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDS", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium—Gallium—Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Syposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214TH ECS Meeting, 2008, No. 2317, ECS.

Kimizuka.N et al., "Spinel,YbFe2O4, and Yb2Fe3O7 Types of Structures for Compounds in the In2O3 and Sc2O3—A2O3—BO Systems [A; Fe, Ga, Or Al; B: Mg, Mn, Fe, Ni, Cu,Or Zn] At Temperatures Over 1000° C.", Journal of Solid State Chemistry, 1985, vol. 60, pp. 382-384.

Kimizuka.N et al., "Syntheses and Single-Crystal Data of Homologous Compounds, In2O3(ZnO)m (m = 3, 4, and 5), InGaO3(ZnO)3, and Ga2O3(Zno)m (m = 7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits , 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED", IDW '06 : Proceedings of the 13th International Display Workshops, Dec. 7, 2006, pp. 663-666.

Lee.J et al., "World'S Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium—Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Meiboom.S et al., "Theory of The Blue Phase of Cholesteric Liquid Crystals", Phys. Rev. Lett. (Physical Review Letters), May 4, 1981, vol. 46, No. 18, pp. 1216-1219.

(56) References Cited

OTHER PUBLICATIONS

Miyasaka.M, "SUFTLA Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M et al., "The phase relations in the $In_2O_3$—$Ga_2ZnO_4$—ZnO system at 1350° C.", Journal of Solid State Chemistry, Aug. 1, 1991, vol. 93, No. 2, pp. 298-315.

Nakamura.M, "Synthesis of Homologous Compound with New Long-Period Structure", NIRIM Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Nomura.K et al., "Carrier transport in transparent oxide semiconductor with intrinsic structural randomness probed using single-crystalline $InGaO_3(ZnO)_5$ films", Appl. Phys. Lett. (Applied Physics Letters) , Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In—Ga—Zn—Oxide TFTs With a Novel Passivation Layer", SID Digest '09 : SID International Symposium Digest of Technical Papers, May 31, 2009, pp. 284-287.

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide $InGaO_3(ZnO)_m$ (m<4):a Zn4s conductor", Philosophical Magazine, 2001, vol. 81, No. 5, pp. 501-515.

Orita.M et al., "Mechanism of Electrical Conductivity of Transparent $InGaZnO_4$", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn—Oxide TFT", SID Digest '09 : SID International Symposium Digest Of Technical Papers, May 31, 2009, pp. 184-187.

Osada.T et al., "Development of Driver-Integrated Panel Using Amorphous In—Ga—Zn—Oxide TFT", AM-FPD '09 Digest of Technical Papers, Jul. 1, 2009, pp. 33-36.

Park.J et al., "Amorphous Indium—Gallium—Zinc Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium—Gallium—Zinc Oxide Semiconductor Upon Exposure to water", Appl. Phys. Lett. (Applied Physics Letters) , 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treament", Appl. Phys. Lett. (Applied Physics Letters) , Jun. 26, 2007, vol. 90, No. 26, pp. 262106-1-262106-3.

Park.S et al., "Challenge to Future Displays: Transparent AM-OLED Driven by PEALD Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Sakata.J et al., "Development of 4.0-In. AMOLED Display With Driver Circuit Using Amorphous In—Ga—Zn—Oxide TFTs", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO ($Ga_2O_3$—$In_2O_3$—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs", IDW '02 : Proceedings of the 9th International Display Workshops, Dec. 4, 2002, pp. 295-298.

Ueno.K et al., "Field-Effect Transistor on $SrTiO_3$ with Sputtered $Al_2O_3$ Gate Insulator", Appl. Phys. Lett. (Applied Physics Letters) , Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

\* cited by examiner

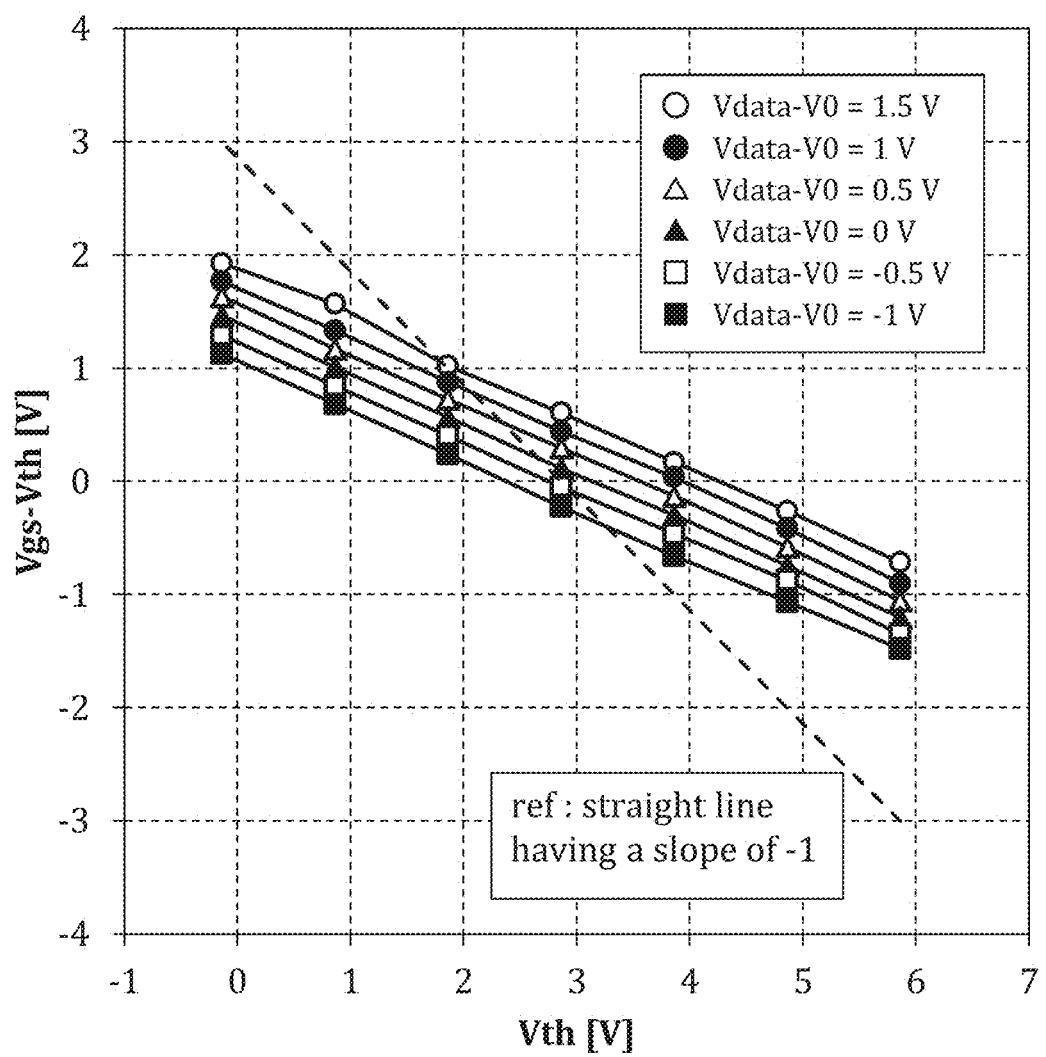

SEMICONDUCTOR DEVICE

BACKGROUND OF THE INVENTION

1. Field of the Invention

The present invention relates to an object, a method, or a manufacturing method. The present invention relates to a process, a machine, manufacture, or a composition of matter. The present invention particularly relates to, for example, a semiconductor device, a display device, a liquid crystal display device, an electroluminescence (EL) display device, a light-emitting device, a lighting device, a memory device, or a processor, relates to a method for manufacturing a semiconductor film, a semiconductor device, a display device, a light-emitting device, a lighting device, a power storage device, a memory device, or a processor, or relates to a method for driving a semiconductor device, a display device, a light-emitting device, a lighting device, a power storage device, a memory device, or a processor. In particular, one embodiment of the present invention relates to, for example, a semiconductor device, a display device, a light-emitting device, a memory device, or a processor including a transistor, or a driving method thereof, or relates to, for example, an electronic device including the semiconductor device, the display device, the light-emitting device, the memory device, or the processor.

In this specification, the semiconductor device indicates all the devices that can function by utilizing semiconductor characteristics. A display device, a light-emitting device, an electro-optical device, a semiconductor circuit, an electronic device, and the like include a semiconductor device in some cases.

2. Description of the Related Art

Attention has been focused on a technique for forming a transistor using a semiconductor film which is formed on a substrate having an insulating surface. The transistor is applied to a wide range of semiconductor devices such as an integrated circuit and a display device.

As a semiconductor film of a transistor, an amorphous silicon film, a polycrystalline silicon film, an oxide semiconductor film, or the like is used depending on the purpose. For example, in the case of a transistor included in a large display device, it is preferable to use an oxide semiconductor film or an amorphous silicon film which can be formed using the established technique for forming a film on a large substrate. On the other hand, in the case of a transistor included in a high-performance display device where driver circuits are formed over the same substrate, it is preferable to use an oxide semiconductor film or a polycrystalline silicon film which can form a transistor having a high field-effect mobility.

In recent years, the resolution of a portable information terminal has been made higher, and the area per pixel has been decreasing. Owing to the decrease in pixel area, the proportion of a wiring, a transistor, and a capacitor in the pixel is increased. The use of a copper wiring having a low resistance is effective in reducing the area of the wiring, for example. The use of a polycrystalline silicon film or an oxide semiconductor film having high field effect mobility is effective in reducing the area of the transistor, for example.

Patent Document 1 discloses a display device including a transistor having an oxide semiconductor film and a capacitor having an oxide semiconductor film.

REFERENCE

Patent Document

[Patent Document 1] PCT International Publication No. 2011-148537

SUMMARY OF THE INVENTION

An object is to provide a capacitor having a large capacitance per area occupied by the capacitor. Another object is to provide a semiconductor device including the capacitor. Another object is to provide a highly integrated semiconductor device. Another object is to provide a novel semiconductor device.

Another object is to provide a high-resolution display device. Another object is to provide a display device having stable display quality.

Note that the descriptions of these objects do not disturb the existence of other objects. In one embodiment of the present invention, there is no need to achieve all the objects. Other objects will be apparent from and can be derived from the description of the specification, the drawings, the claims, and the like.

One embodiment of the present invention is described below.

(1) A semiconductor device includes a first conductive film and a second conductive film over an insulating surface; a first insulating film over the insulating surface, the first conductive film, and the second conductive film; a semiconductor film overlapping with the first conductive film with the first insulating film provided therebetween; a third conductive film in contact with the semiconductor film; a fourth conductive film that is in contact with the semiconductor film and overlaps with the second conductive film with the first insulating film provided therebetween; a second insulating film including a thick region and a thin region, over the semiconductor film, the third conductive film, and the fourth conductive film; a fifth conductive film overlapping with the semiconductor film with the second insulating film provided therebetween; and a sixth conductive film overlapping with the fourth conductive film over the thin region of the second insulating film.

(2) A semiconductor device includes a first conductive film and a second conductive film over an insulating surface; a first insulating film including a thick region and a thin region, over the insulating surface, the first conductive film, and the second conductive film; a semiconductor film overlapping with the first conductive film with the first insulating film provided therebetween; a third conductive film being in contact with the semiconductor film; a fourth conductive film that is in contact with the semiconductor film and overlaps with the second conductive film over the thin region of the first insulating film; a second insulating film over the semiconductor film, the third conductive film, and the fourth conductive film; a fifth conductive film overlapping with the semiconductor film with the second insulating film provided therebetween; and a sixth conductive film overlapping with the fourth conductive film with the second insulating film provided therebetween.

(3) A semiconductor device includes a first conductive film and a second conductive film over an insulating surface; a first insulating film including a thick region and a thin region, over the insulating surface, the first conductive film, and the second conductive film; a semiconductor film overlapping with the first conductive film with the first insulating film provided therebetween; a third conductive film in contact with the semiconductor film; a fourth conductive film in contact with the semiconductor film and overlapping with the second conductive film over the thin region of the first insulating film; a second insulating film including a thick region and a thin region, over the semiconductor film, the third conductive film, and the fourth conductive film; a fifth conductive film overlapping with the semiconductor film with the second insulating film provided therebetween; and a sixth conductive film overlapping with the fourth conductive film over the thin region of the second insulating film.

(4) The semiconductor device according to any one of (1) to (3) includes an oxide semiconductor film as the semiconductor film.

(5) The semiconductor device according to any one of (1) to (3) includes a polycrystalline silicon film as the semiconductor film.

(6) The semiconductor device according to any one of (1) to (5) further includes a third insulating film over the second insulating film, the fifth conductive film, and the sixth conductive film, and a display element that is over the third insulating film and electrically connected to the fourth conductive film.

A capacitor having a large capacitance per area occupied by the capacitor can be provided. A semiconductor device having the capacitor can be provided. A highly integrated semiconductor device can be provided. A novel semiconductor device can be provided. Note that one embodiment of the present invention is not limited to these effects. For example, depending on circumstances or conditions, one embodiment of the present invention might produce another effect. Furthermore, depending on circumstances or conditions, one embodiment of the present invention might not produce any of the above effects.

A high-resolution display device can be provided. A display device having stable display quality can be provided.

BRIEF DESCRIPTION OF THE DRAWINGS

FIG. 17 is a graph showing the capability of threshold voltage compensation of a display device according to one embodiment of the present invention.

DETAILED DESCRIPTION OF THE INVENTION

Figure 1A:
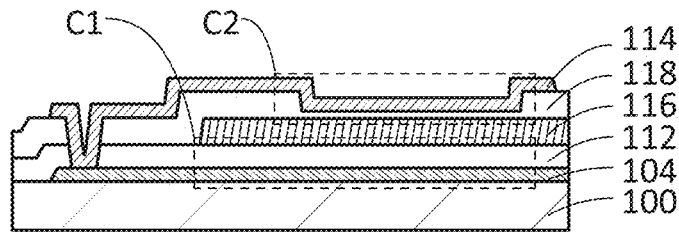
FIGS. 1A to 1D are cross-sectional views and a circuit diagram which illustrate an example of a capacitor according to one embodiment of the present invention.

An embodiment of the present invention will be described in detail with the reference to the drawings. However, the present invention is not limited to the description below, and it is easily understood by those skilled in the art that modes and details disclosed herein can be modified in various ways. Further, the present invention is not construed as being limited to description of the embodiment. In describing structures of the present invention with reference to the drawings, the same reference numerals are used in common for the same portions in different drawings. Note that the same hatched pattern is applied to similar parts, and the similar parts are not especially denoted by reference numerals in some cases.

Note that what is described in an embodiment can be applied to, combined with, or exchanged with another content in the same embodiment.

Note that the size, the thickness of layers, or regions in diagrams is sometimes exaggerated for simplicity. Therefore, an embodiment of the present invention is not limited to such a scale.

A voltage usually refers to a potential difference between a given potential and a reference potential (e.g., a source potential or a ground potential (GND)). A voltage can be referred to as a potential and vice versa.

Even when the expression "electrically connect" is used in this specification, in an actual circuit, there is a case in which no physical connection is made and a wiring is just extended.

Note that the ordinal numbers such as "first" and "second" in this specification are used for the sake of convenience and do not denote the order of steps or the stacking order of layers. Therefore, for example, the term "first" can be replaced with the term "second", "third", or the like as appropriate. In addition, the ordinal numbers in this specification and the like are not necessarily the same as those which specify one embodiment of the present invention.

In this specification, for example, when the shape of an object is described with use of a term such as "diameter", "grain size (diameter)", "dimension", "size", or "width", the term can be regarded as the length of one side of a minimal cube where the object fits, or an equivalent circle diameter of a cross section of the object. The term "equivalent circle diameter of a cross section of the object" refers to the diameter of a perfect circle having the same area as that of the cross section of the object.

Note that a "semiconductor" includes characteristics of an "insulator" in some cases when the conductivity is sufficiently low, for example. Further, a "semiconductor" and an "insulator" cannot be strictly distinguished from each other in some cases because a border between the "semiconductor" and the "insulator" is not clear. Accordingly, a "semiconductor" in this specification can be called an "insulator" in some cases. Similarly, an "insulator" in this specification can be called a "semiconductor" in some cases.

Further, a "semiconductor" includes characteristics of a "conductor" in some cases when the conductivity is sufficiently high, for example. Further, a "semiconductor" and a "conductor" cannot be strictly distinguished from each other in some cases because a border between the "semiconductor" and the "conductor" is not clear. Accordingly, a "semiconductor" in this specification can be called a "conductor" in some cases. Similarly, a "conductor" in this specification can be called a "semiconductor" in some cases.

Note that an impurity in a semiconductor film refers to, for example, elements other than the main components of a semiconductor film. For example, an element with a concentration of lower than 0.1 atomic % is an impurity. When an impurity is contained, carrier traps may be formed in the semiconductor film, the carrier mobility may be decreased, or the crystallinity may be decreased, for example. In the case where the semiconductor film is an oxide semiconductor film, examples of an impurity which changes characteristics of the semiconductor film include Group 1 elements, Group 2 elements, Group 14 elements, Group 15 elements, and transition metals other than the main components; specifically, there are hydrogen (included in water), lithium, sodium, silicon, boron, phosphorus, carbon, and nitrogen, for example. In the case where the semiconductor is an oxide semiconductor, oxygen vacancies may be formed by entry of impurities. Further, when the semiconductor film is a silicon film, examples of an impurity which changes the characteristics of the semiconductor film include oxygen, Group 1 elements except hydrogen, Group 2 elements, Group 13 elements, and Group 15 elements.

In this specification, excess oxygen refers to oxygen in excess of the stoichiometric composition, for example. Alternatively, excess oxygen refers to oxygen released by heating, for example. Excess oxygen can move inside a film or a layer. Excess oxygen moves between atoms in a film or a layer or excess oxygen replaces oxygen that is a constituent of a film or a layer and moves like a billiard ball. An insulating film having excess oxygen means an insulating film from which oxygen is released by heat treatment, for example.

In this specification, a term "parallel" indicates that the angle formed between two straight lines is greater than or equal to $-10°$ and less than or equal to $10°$, and accordingly also includes the case where the angle is greater than or equal to $-5°$ and less than or equal to $5°$. In addition, a term "perpendicular" indicates that the angle formed between two straight lines is greater than or equal to $80°$ and less than or equal to $100°$, and accordingly includes the case where the angle is greater than or equal to $85°$ and less than or equal to $95°$.

In the embodiment, a conductive film may be formed using, for example, a single layer or a stack of a conductive film containing aluminum, titanium, chromium, cobalt, nickel, copper, yttrium, zirconium, molybdenum, ruthenium, silver, tantalum, or tungsten. As a light-transmitting conductive film, for example, an oxide film such as an In—Zn—W oxide film, an In—Sn oxide film, an In—Zn oxide film, an indium oxide film, a zinc oxide film, or a tin oxide film may be used. Further, a slight amount of Al, Ga, Sb, F, or the like may be added to the above-described oxide film. Further, a metal thin film having a thickness which enables light to be transmitted (preferably, approximately greater than or equal to 5 nm and less than or equal to 30 nm) can also be used. For example, an Ag film, a Mg film, or an Ag—Mg alloy film with a thickness of 5 nm may be used. For example, as a film that reflects visible light efficiently, a film containing lithium, aluminum, titanium, magnesium, lanthanum, silver, silicon, or nickel can be used.

As an insulating film, for example, a single layer or a stack of an insulating film containing aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, or tantalum oxide may be used. Furthermore, a resin film made of a polyimide resin, an acrylic resin, an epoxy resin, a silicone resin, or the like may be used.

<Capacitor>

A capacitor according to one embodiment of the present invention is described below with reference to FIGS. 1A to 1D.

Figure 1B:
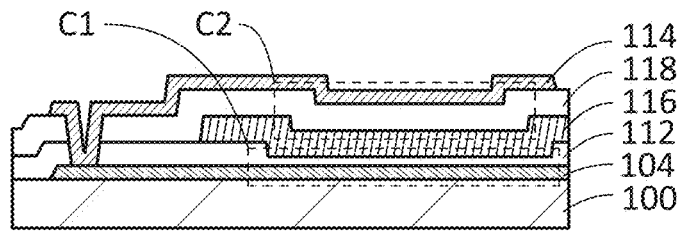
Figure 1C:
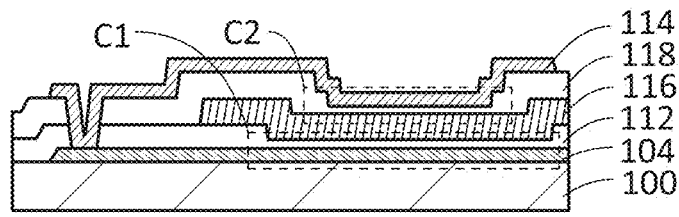
Figure 1D:
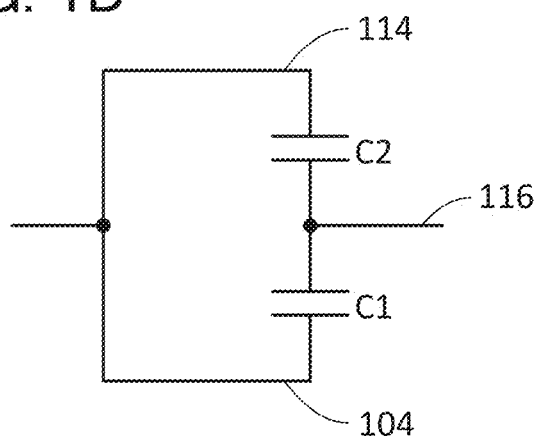

FIGS. 1A to 1C illustrate examples of a cross-sectional view of a capacitor.

A capacitor illustrated in FIG. 1A includes a conductive film 104 over a substrate 100; an insulating film 112 over the conductive film 104; a conductive film 116 overlapping with the conductive film 104 with the insulating film 112 provided therebetween; an insulating film 118 having a thick region and a thin region, over the conductive film 116; and a conductive film 114 overlapping with the conductive film 116 with the thin region of the insulating film 118 provided therebetween. Note that the conductive film 114 is electrically connected to the conductive film 104 through an opening portion in the insulating film 112 and the insulating film 118.

A capacitor illustrated in FIG. 1B includes the conductive film 104 over the substrate 100; the insulating film 112 having a thick region and a thin region, over the conductive film 104; the conductive film 116 overlapping with the conductive film 104 with the thin region of the insulating film 112 provided therebetween; the insulating film 118 over the conductive film 116; and the conductive film 114 overlapping with the conductive film 116 with the insulating film 118 provided therebetween. Note that the conductive film 114 is electrically connected to the conductive film 104 through the opening portion in the insulating film 112 and the insulating film 118.

A capacitor illustrated in FIG. 1C includes the conductive film 104 over the substrate 100; the insulating film 112 having the thick region and the thin region, over the conductive film 104; the conductive film 116 overlapping with the conductive film 104 with the thin region of the insulating film 112 provided therebetween; the insulating film 118 having the thick region and the thin region, over the conductive film 116; and the conductive film 114 overlapping with the conductive film 116 with the thin region of the insulating film 118 provided therebetween. Note that the conductive film 114 is electrically connected to the conductive film 104 through the opening portion in the insulating film 112 and the insulating film 118.

A transistor and a capacitor can be formed using any of a variety of substrates, for example. The type of a substrate is not limited to a certain type. Examples of the substrate include a semiconductor substrate (e.g., a single crystal substrate or a silicon substrate), an SOI substrate, a glass substrate, a quartz substrate, a plastic substrate, a metal substrate, a stainless steel substrate, a substrate including stainless steel foil, a tungsten substrate, a substrate including tungsten foil, a flexible substrate, an attachment film, paper including a fibrous material, and a base material film. For a glass substrate, a barium borosilicate glass substrate, an aluminoborosilicate glass substrate, soda lime glass substrate, and the like can be used, for example. For a flexible substrate, a flexible synthetic resin such as plastics typified by polyethylene terephthalate (PET), polyethylene naphthalate (PEN), and polyether sulfone (PES), or acrylic can be used, for example. For an attachment film, polypropylene, polyester, polyvinyl fluoride, polyvinyl chloride, or the like can be used, for example. For a base material film, polyester, polyamide, polyimide, an inorganic vapor deposition film, paper, or the like can be used, for example. Specifically, when a transistor is formed using a semiconductor substrate, an SOI substrate, or the like, it is possible to form a transistor with few variations in characteristics, size, shape, or the like and with high current supply capability and a small size. By forming a circuit with the use of such a transistor, power consumption of the circuit can be reduced or the circuit can be highly integrated.

Note that the transistor or the capacitor may be formed using one substrate, and then, the transistor or the capacitor may be transferred to another substrate. Examples of a substrate to which the transistor or the capacitor is transferred include, in addition to the above-described substrates over which the transistors or the capacitors can be formed, a paper substrate, a cellophane substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupra, rayon, or regenerated polyester), or the like), a leather substrate, a rubber substrate, and the like. With the use of such a substrate, a transistor with excellent properties, a transistor with low power consumption, or a device with high durability can be formed, high heat resistance can be provided, or a reduction in weight or thickness can be achieved.

Note that all the circuits needed to realize a desired function can be formed using one substrate. In this manner, costs can be reduced by reduction in the number of components or the reliability can be improved by reduction in the number of connections to circuit components.

Note that it is possible not to form all the circuits that are necessary to realize the predetermined function using the same substrate. That is, a part of the circuits needed to realize the predetermined function may be formed using one substrate and another part of the circuits needed to realize the predetermined function may be formed using another substrate. For example, a part of the circuits needed to realize the predetermined function can be formed using a glass substrate and another part of the circuits needed to realize the predetermined function can be formed using a semiconductor substrate (or an SOI substrate). Then, a semiconductor substrate where a part of the circuits needed to realize the predetermined function (such a substrate is also referred to as an IC chip) can be connected to a glass substrate by COG (chip on glass), and an IC chip can be provided over the glass substrate. Alternatively, an IC chip can be connected to a glass substrate using TAB (tape automated bonding), COF (chip on film), SMT (surface mount technology), a printed circuit board, or the like. When a part of the circuits are formed over a substrate where a pixel portion is formed in this manner, cost can be reduced by reduction in the number of component parts or reliability can be improved by reduction in the number of connections between circuit components. In particular, a circuit with high driving voltage, a circuit with high driving frequency, or the like consumes a large amount of power in many cases. In order to deal with it, such a circuit is formed over a substrate which is different from a substrate where the pixel portion is formed, so that an IC chip is formed. By the use of this IC chip, an increase in power consumption can be prevented.

The capacitors illustrated in FIGS. 1A to 1C each include a capacitor C1 having the conductive film 104, the insulating film 112, and the conductive film 116 and a capacitor C2 having the conductive film 116, the insulating film 118, and the conductive film 114. Thus, each of the capacitors illustrated in FIGS. 1A to 1C can be represented by a circuit diagram in which the capacitor C1 and the capacitor C2 are connected in parallel (see FIG. 1D). That is, the capacitance of each of the capacitors illustrated in FIGS. 1A to 1C is the sum of the capacitance of the capacitor C1 and the capacitance of the capacitor C2.

In the capacitor illustrated in FIG. 1A, the capacitor C2 is formed using the thin region of the insulating film 118; thus, the capacitance per area occupied by the capacitor can be increased. In the capacitor illustrated in FIG. 1B, the capacitor C1 is formed using the thin region of the insulating film 112; thus, the capacitance per area occupied by the capacitor can be increased. In the capacitor illustrated in FIG. 1C, the capacitor C1 is formed using the thin region of the insulating film 112, and the capacitor C2 is formed using the thin region of the insulating film 118; thus, the capacitance per area occupied by the capacitor can be increased.

As described above, the capacitors illustrated in FIGS. 1A to 1C are each a capacitor having a large capacitance per area occupied by the capacitor.

By using any of the capacitors illustrated in FIGS. 1A to 1C for a semiconductor device, the degree of integration of the semiconductor device can be increased. Furthermore, the semiconductor device including the capacitor that has a large capacitance and occupies a small area can be provided.

The capacitors illustrated in FIGS. 1A to 1C can be manufactured, for example, through the same step as a transistor. For example, a conductive film formed through the same step as the conductive film 104 can be used as a gate electrode of the transistor, an insulating film formed through the same step as the insulating film 112 can be used as a gate insulating film of the transistor, a conductive film formed through the same step as the conductive film 116 can be used as a source electrode or a drain electrode of the transistor, an insulating film formed through the same step as the insulating film 118 can be used as a protective insulating film of the transistor, and a conductive film formed through the same step as the conductive film 114 can be used as a second gate electrode of the transistor. Note that in the case where the conductive film formed through the same step as the conductive film 114 is used as a second gate electrode of a transistor, the insulating film formed through the same step as the insulating film 118 can serve as a second gate insulating film of the transistor. Note that the thick region and the thin region of the insulating film of the capacitor may be formed by a photolithography step using a multi-tone mask (also referred to as gray-tone mask). The use of the multi-tone mask allows reduction in the number of photomasks and improvement in productivity in some cases.

By combining a transistor and a capacitor in this manner, a desired semiconductor device can be manufactured. Examples of the semiconductor device include a display device, a memory device, and a processor. The capacitors illustrated in FIGS. 1A to 1C are each a capacitor having a large capacitance per area occupied by the capacitor. Thus, with the use of the capacitor, a display device having high display quality, a memory device having excellent retention characteristics, a processor with low power consumption, and the like can be obtained. Furthermore, a high-resolution display device, a highly integrated memory device, and a highly integrated processor can be achieved.

A conductive film having a light-transmitting property may be used for at least a part of the conductive film of the capacitors illustrated in FIGS. 1A to 1C. In that case, the aperture ratio of a display device including the capacitor may be increased, for example. Furthermore, the power consumption of a display device including the capacitor may be reduced.

Note that one embodiment of the present invention is not limited thereto. Depending on circumstances or conditions, the insulating film of the capacitor is not necessarily thin.

<Display Device>

A display device of one embodiment of the present invention is described below with reference to FIGS. 2A to 2C, FIGS. 3A and 3B, FIGS. 4A and 4B, FIGS. 5A and 5B, FIGS. 6A to 6C, FIGS. 7A and 7B, FIGS. 8A and 8B, FIGS. 9A and 9B, FIGS. 10A and 10B, FIGS. 11A and 11B, FIGS. 12A and 12B, FIGS. 13A and 13B, and FIGS. 14A and 14B.

Examples of a display element provided in the display device include a liquid crystal element (also referred to as a liquid crystal display element) and a light-emitting element (also referred to as a light-emitting display element). The light-emitting element includes, in its category, an element whose luminance is controlled by a current or voltage, and specifically includes, in its category, an inorganic EL element, an organic EL element, and the like. Other examples of the display element include a display medium whose contrast is changed by an electric effect such as electronic ink and an electrophoretic element, a grating light valve (GLV), a plasma display panel (PDP), a micro electro mechanical system (MEMS), a digital micromirror device (DMD), a digital micro shutter (DMS), an interferometric modulator display (IMOD) element, an electrowetting element, a piezoelectric ceramic display, and a carbon nanotube. A display device including an EL element (such a display device is also referred to as EL display device) and a display device including a liquid crystal element (such a display device is also referred to as liquid crystal display device) are described below as examples of the display device.

Note that the display device described below includes in its category a panel in which a display element is sealed and a module in which an IC such as a controller is mounted on the panel.

The display device described below refers to an image display device or a light source (including a lighting device). The display device includes any of the following modules: a module provided with a connector such as an FPC or TCP; a module in which a printed wiring board is provided at the end of TCP; and a module in which an integrated circuit (IC) is mounted directly on a display element by a COG method.

Figure 2A:
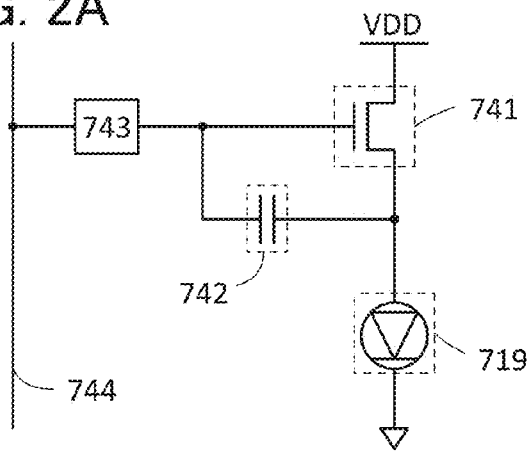
FIGS. 2A to 2C are a circuit diagram, a top view, and a cross-sectional view which illustrate an example of a display device according to one embodiment of the present invention.
Figure 2B:
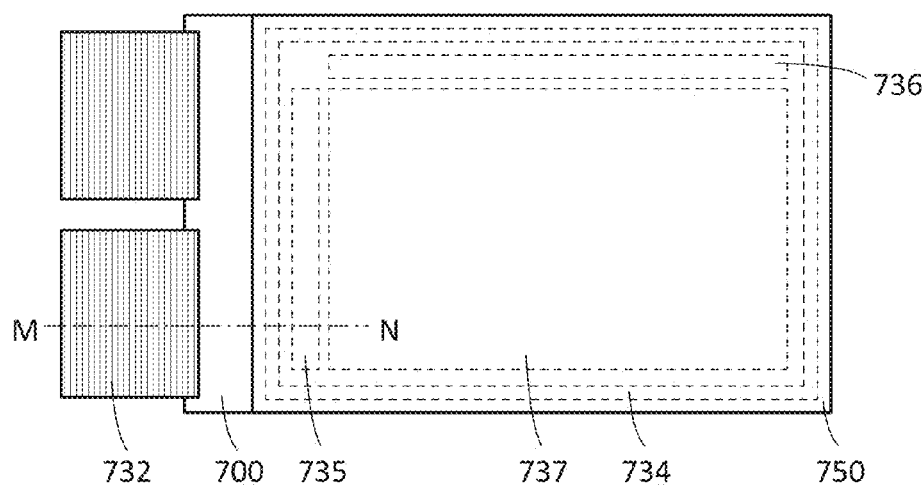
Figure 2C:
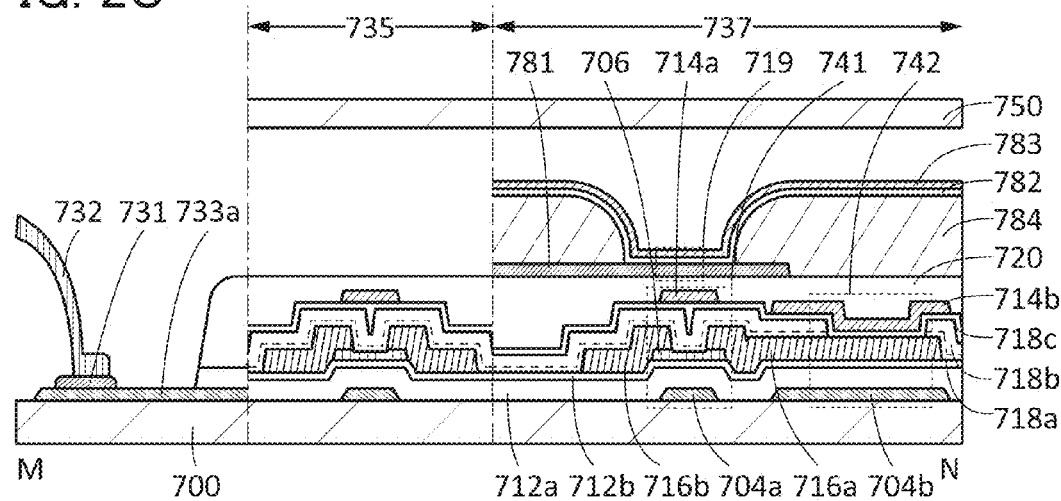

FIGS. 2A to 2C show an example of an EL display device according to one embodiment of the present invention. FIG. 2A is a circuit diagram of a pixel in an EL display device. FIG. 2B is a top view showing the whole of the EL display device. FIG. 2C is a cross-sectional view taken along part of dashed-dotted line M-N in FIG. 2B.

FIG. 2A illustrates an example of a circuit diagram of a pixel used in an EL display device.

Note that in this specification and the like, it might be possible for those skilled in the art to constitute one embodiment of the invention even when portions to which all the terminals of an active element (e.g., a transistor or a diode), a passive element (e.g., a capacitor or a resistor), or the like are connected are not specified. In other words, one embodiment of the invention can be clear even when connection portions are not specified. Further, in the case where a connection portion is disclosed in this specification and the like, it can be determined that one embodiment of the invention in which a connection portion is not specified is disclosed in this specification and the like, in some cases. Particularly in the case where the number of portions to which a terminal is connected might be plural, it is not necessary to specify the portions to which the terminal is connected. Therefore, it might be possible to constitute one embodiment of the invention by specifying only portions to which some of terminals of an active element (e.g., a transistor or a diode), a passive element (e.g., a capacitor or a resistor), or the like are connected.

Note that in this specification and the like, it might be possible for those skilled in the art to specify the invention when at least the connection portion of a circuit is specified. Alternatively, it might be possible for those skilled in the art to specify the invention when at least a function of a circuit is specified. In other words, when a function of a circuit is specified, one embodiment of the present invention can be clear. Further, it can be determined that one embodiment of the present invention whose function is specified is disclosed in this specification and the like. Therefore, when a connection portion of a circuit is specified, the circuit is disclosed as one embodiment of the invention even when a function is not specified, and one embodiment of the invention can be constituted. Alternatively, when a function of a circuit is specified, the circuit is disclosed as one embodiment of the invention even when a connection portion is not specified, and one embodiment of the invention can be constituted.

The EL display device illustrated in FIG. 2A includes a switching element 743, a transistor 741, a capacitor 742, and a light-emitting element 719.

Note that FIG. 2A and the like each illustrate an example of a circuit structure; therefore, a transistor can be provided additionally. In contrast, for each node in FIG. 2A and the like, it is possible not to provide an additional transistor, switch, passive element, or the like.

A gate of the transistor 741 is electrically connected to one terminal of the switching element 743 and one electrode of the capacitor 742. A source of the transistor 741 is electrically connected to the other electrode of the capacitor 742 and one electrode of the light-emitting element 719. A drain of the transistor 741 is supplied with a power supply potential VDD. The other terminal of the switching element 743 is electrically connected to a signal line 744. A constant potential is supplied to the other electrode of the light-emitting element 719. The constant potential is a ground potential GND or a potential lower than the ground potential GND.

It is preferable to use a transistor as the switching element 743. When the transistor is used as the switching element, the area of a pixel can be reduced, so that the EL display device can have high resolution. As the switching element 743, a transistor formed through the same step as the transistor 741 can be used, so that EL display devices can be manufactured with high productivity.

FIG. 2B is a top view of the EL display device. The EL display device includes a substrate 700, a substrate 750, a sealant 734, a driver circuit 735, a driver circuit 736, a pixel 737, and an FPC 732. The sealant 734 is provided between the substrate 700 and the substrate 750 so as to surround the pixel 737, the driver circuit 735, and the driver circuit 736. Note that the driver circuit 735 and/or the driver circuit 736 may be provided outside the sealant 734.

FIG. 2C is a cross-sectional view of the EL display device taken along part of dashed-dotted line M-N in FIG. 2B.

FIG. 2C illustrates a structure of the transistor 741 including a conductive film 704a over the substrate 700; an insulating film 712a over the conductive film 704a; an insulating film 712b over the insulating film 712a; a semiconductor film 706 that is over the insulating film 712b and overlaps with the conductive film 704a; a conductive film 716a and a conductive film 716b in contact with the semiconductor film 706; an insulating film 718a over the semiconductor film 706, the conductive film 716a, and the conductive film 716b; an insulating film 718b over the insulating film 718a; an insulating film 718c over the insulating film 718b; and a conductive film 714a that is over the insulating film 718c and overlaps with the semiconductor film 706. Note that the structure of the transistor 741 is just an example; the transistor 741 may have a structure different from that illustrated in FIG. 2C.

Thus, in the transistor 741 illustrated in FIG. 2C, the conductive film 704a serves as a gate electrode, the insulating film 712a and the insulating film 712b serve as a gate insulating film, the conductive film 716a serves as a source electrode, the conductive film 716b serves as a drain electrode, the insulating film 718a, the insulating film 718b, and the insulating film 718c serve as a gate insulating film, and the conductive film 714a serves as a gate electrode. Note that in some cases, electrical characteristics of the semiconductor film 706 change if light enters the semiconductor film 706. To prevent this, it is preferable that one or more of the conductive film 704a, the conductive film 716a, the conductive film 716b, and the conductive film 714a have a light-blocking property.

Note that the interface between the insulating film 718a and the insulating film 718b is indicated by a broken line. This means that the boundary between them is not clear in some cases. For example, in the case where the insulating film 718a and the insulating film 718b are formed using insulating films of the same kind, the insulating film 718a and the insulating film 718b are not distinguished from each other in some cases depending on an observation method.

FIG. 2C illustrates a structure of the capacitor 742 including a conductive film 704b over the substrate; the insulating film 712a over the conductive film 704b; the insulating film 712b over the insulating film 712a; the conductive film 716a that is over the insulating film 712b and overlaps with the conductive film 704b; the insulating film 718a over the conductive film 716a; the insulating film 718b over the insulating film 718a; the insulating film 718c over the insulating film 718b; and a conductive film 714b that is over the insulating film 718c and overlaps with the conductive film 716a. In the structure, a part of the insulating film 718a and a part of the insulating film 718b are removed in a region where the conductive film 716a and the conductive film 714b overlap with each other.

In the capacitor 742, each of the conductive film 704b and the conductive film 714b serves as one electrode, and the conductive film 716a serves as the other electrode.

Thus, the capacitor 742 can be formed using a film of the transistor 741. The conductive film 704a and the conductive film 704b are preferably conductive films of the same kind, in which case the conductive film 704a and the conductive film 704b can be formed through the same step. Furthermore, the conductive film 714a and the conductive film 714b are preferably conductive films of the same kind, in which case the conductive film 714a and the conductive film 714b can be formed through the same step.

The structure of the capacitor 742 illustrated in FIG. 2C is similar to that of the capacitor illustrated in FIG. 1A. The capacitor 742 illustrated in FIG. 2C has a large capacitance per area occupied by the capacitor, like the capacitor illustrated in FIG. 1A. Therefore, the EL display device illustrated in FIG. 2C has high display quality. Note that although the capacitor 742 illustrated in FIG. 2C has the structure in which the part of the insulating film 718a and the part of the insulating film 718b are removed to reduce the thickness of the region where the conductive film 716a and the conductive film 714b overlap with each other, the structure of the capacitor according to one embodiment of the present invention is not limited to the structure. For example, a structure in which a part of the insulating film 718c is removed to reduce the thickness of the region where the conductive film 716a and the conductive film 714b overlap with each other may be used.

Note that the structure of the capacitor 742 is just an example and may be different from that illustrated in FIG. 2C. For example, an EL display device illustrated in FIG. 3A includes the capacitor 742 having a structure similar to that of the capacitor illustrated in FIG. 1B. Specifically, the capacitor 742 illustrated in FIG. 3A has a structure in which a part of the insulating film 712b is removed in a region where the conductive film 704b and the conductive film 716a overlap with each other. Note that although the capacitor 742 illustrated in FIG. 3A has the structure in which the part of the insulating film 712b is removed to reduce the thickness of the region where the conductive film 704b and the conductive film 716a overlap with each other, the structure of the capacitor according to one embodiment of the present invention is not limited to the structure. For example, a structure in which a part of the insulating film 712a is removed to reduce the thickness of the region where the conductive film 704b and the conductive film 716a overlap with each other may be used.

Figure 3A:
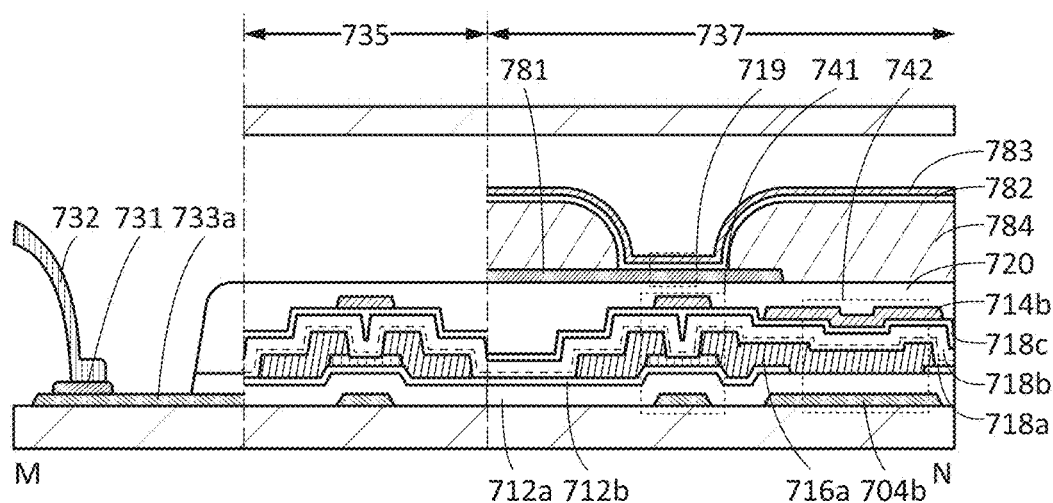
FIGS. 3A and 3B are cross-sectional views illustrating examples of display devices according to one embodiment of the present invention.
Figure 3B:
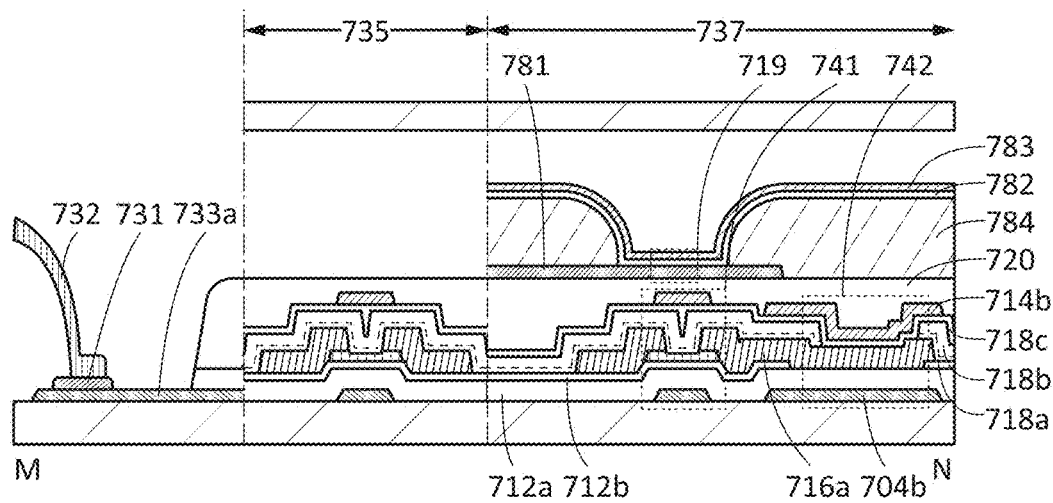

The structure of the capacitor 742 is just an example and may be different from those illustrated in FIG. 2C and FIG. 3A. For example, FIG. 3B illustrates an EL display device having a structure similar to that of the capacitor illustrated in FIG. 1C. Specifically, the capacitor 742 illustrated in FIG. 3B has a structure in which the part of the insulating film 712b is removed in the region where the conductive film 704b and the conductive film 716a overlap with each other, and the part of the insulating film 718a and the part of the insulating film 718b are removed in the region where the conductive film 716a and the conductive film 714b overlap with each other. Note that although the capacitor 742 illustrated in FIG. 3B has the structure in which the part of the insulating film 718a and the part of the insulating film 718b are removed to reduce the thickness of the region where the conductive film 716a and the conductive film 714b overlap with each other, the structure of the capacitor according to one embodiment of the present invention is not limited to the structure. For example, the structure in which the part of the insulating film 718c is removed to reduce the thickness of the region where the conductive film 716a and the conductive film 714b overlap with each other may be used. Furthermore, although the capacitor 742 illustrated in FIG. 3B has the structure in which the part of the insulating film 712b is removed to reduce the thickness of the region where the conductive film 704b and the conductive film 716a overlap with each other, the structure of the capacitor according to one embodiment of the present invention is not limited to the structure. For example, the structure in which the part of the insulating film 712a is removed to reduce the thickness of the region where the conductive film 704b and the conductive film 716a overlap with each other may be used.

Figure 4A:
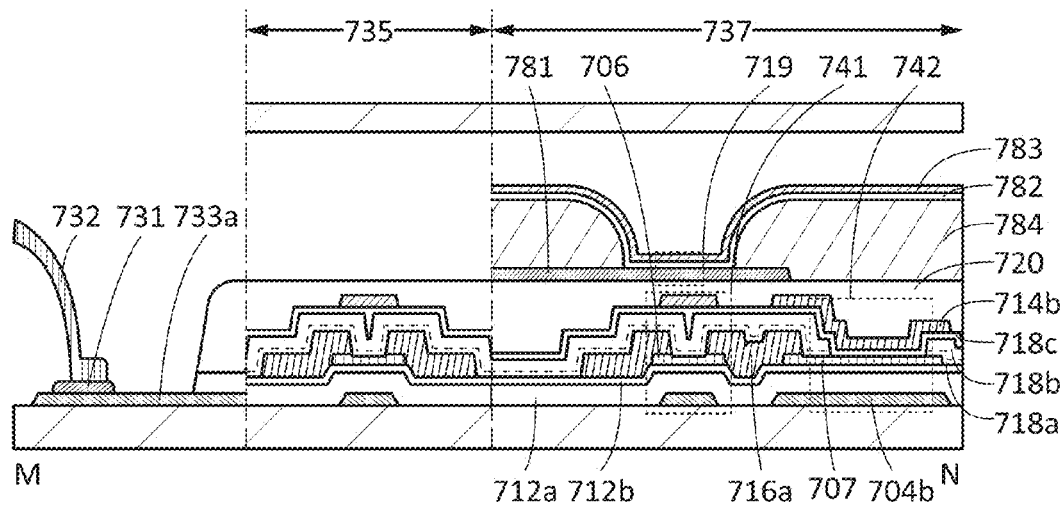
FIGS. 4A and 4B are cross-sectional views illustrating examples of display devices according to one embodiment of the present invention.
Figure 4B:
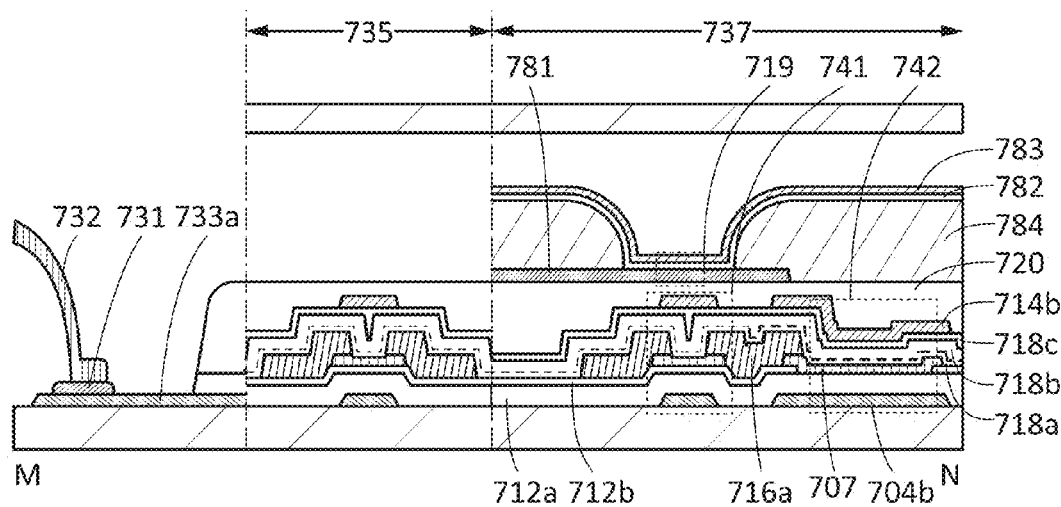

FIG. 2C, FIG. 3A, and FIG. 3B each illustrate the structure in which the conductive film 716a that serves as the source electrode of the transistor 741 is included in a part of the capacitor 742. FIGS. 4A and 4B each illustrate a structure in which a semiconductor film 707 is included in a part of the capacitor 742.

FIG. 4A illustrates a structure of the capacitor 742 including the conductive film 704b over the substrate, the insulating film 712a over the conductive film 704b, the insulating film 712b over the insulating film 712a, the semiconductor film 707 that is over the insulating film 712b and overlaps with the conductive film 704b, the insulating film 718a over the semiconductor film 707, the insulating film 718b over the insulating film 718a, the insulating film 718c over the insulating film 718b, and the conductive film 714b that is over the insulating film 718c and overlaps with the semiconductor film 707. In the structure, a part of the insulating film 718a and a part of the insulating film 718b are removed in a region where the semiconductor film 707 and the conductive film 714b overlap with each other.

The semiconductor film 707 is preferably formed using a semiconductor film that serves as an electrode of the capacitor 742. Thus, the semiconductor film 707 is preferably formed using a degenerated semiconductor. Note that even in the case where the carrier density of the semiconductor film 707 is low, carriers can be induced to the semiconductor film 707 by an electric field from the conductive film 704b and/or the conductive film 714b.

Note that the semiconductor film 706 and the semiconductor film 707 are preferably semiconductor films of the same kind, in which case the semiconductor film 706 and the semiconductor film 707 can be formed through the same step.

The semiconductor film 706 is preferably formed using a semiconductor film with low carrier density because the semiconductor film 706 serves as a semiconductor film of the transistor 741. In contrast, the semiconductor film 707 is preferably formed using a semiconductor film with high carrier density because the semiconductor film 707 serves as the electrode of the capacitor 742. Thus, in the case where the semiconductor film 706 and the semiconductor film 707 are formed through the same step, the semiconductor film 706 and the semiconductor film 707 are preferably formed so that each of them has appropriate carrier density in a later step.

For example, after forming semiconductor films with high carrier density as the semiconductor film 706 and the semiconductor film 707, the carrier density of the semiconductor film 706 may be reduced. As an example of a method for reducing the carrier density of the semiconductor film 706, an acceptor may be implanted in the case where the semiconductor film 706 is an n-type semiconductor, or a donor may be implanted in the case where the semiconductor film 706 is a p-type semiconductor. Alternatively, carrier generation sources in the semiconductor film 706 can be reduced. For example, in the case where the semiconductor film 706 is an oxide semiconductor film, hydrogen is trapped by oxygen vacancies in the oxide semiconductor film to generate electrons in some cases. Thus, in the case of using the oxide semiconductor film as the semiconductor film 706, the carrier density of the semiconductor film 706 can be reduced by supplying oxygen to the oxide semiconductor film to reduce oxygen vacancies therein or by applying heat or the like to the oxide semiconductor film to reduce hydrogen therein.

As another example, after forming semiconductor films with low carrier density as the semiconductor film 706 and the semiconductor film 707, the carrier density of the semiconductor film 707 may be increased. As an example of a method for increasing the carrier density of the semiconductor film 707, a dopant may be implanted into the semiconductor film 707. Alternatively, carrier generation sources may be formed in the semiconductor film 707. For example, in the case where the semiconductor film 707 is an oxide semiconductor film, hydrogen can be trapped by oxygen vacancies in the oxide semiconductor film to generate electrons. Thus, in the case of using the oxide semiconductor film, the carrier density of the semiconductor film 707 can be increased by releasing oxygen from the oxide semiconductor film in a reducing environment or by supplying hydrogen to the oxide semiconductor film.

In the capacitor 742 illustrated in FIG. 4A, for example, an insulating film containing an impurity which serves as a carrier generation source in the semiconductor film 707 may be used as the insulating film 718c to increase the carrier density of the semiconductor film 707. Specifically, in the case where the semiconductor film 707 is an oxide semiconductor film, an insulating film containing hydrogen may be used as the insulating film 718c to increase the carrier density of the semiconductor film 707. A silicon nitride film, a silicon nitride oxide film, or the like is preferably used as the insulating film containing hydrogen. Therefore, a structure in which the insulating film 718c and the semiconductor film 707 are in contact with each other can increase the capacitance of the capacitor 742 and can also increase the carrier density of the semiconductor film 707. Thus, the number of steps of manufacturing a display device can be reduced, achieving the increase in production efficiency of display devices.

Note that although the capacitor 742 illustrated in FIG. 4A has the structure in which the part of the insulating film 718a and the part of the insulating film 718b are removed to reduce the thickness of the region where the semiconductor film 707 and the conductive film 714b overlap with each other, the structure of the capacitor according to one embodiment of the present invention is not limited to the structure. For example, the structure in which the part of the insulating film 718c is removed to reduce the thickness of the region where the semiconductor film 707 and the conductive film 714b overlap with each other may be used.

An example of the capacitor 742 including the semiconductor film 707, which is different from that of the capacitor 742 illustrated in FIG. 4A, is described. The capacitor 742 illustrated in FIG. 4B has a structure in which the part of the insulating film 712b is removed in a region where the conductive film 704b and the semiconductor film 707 overlap with each other. Note that although the capacitor 742 illustrated in FIG. 4B has the structure in which the part of the insulating film 712b is removed to reduce the thickness of the region where the conductive film 704b and the semiconductor film 707 overlap with each other, the structure of the capacitor according to one embodiment of the present invention is not limited to the structure. For example, the structure in which the part of the insulating film 712a is removed to reduce the thickness of the region where the conductive film 704b and the semiconductor film 707 overlap with each other may be used.

In FIG. 2C, FIG. 3A, FIG. 3B, FIG. 4A, and FIG. 4B, an FPC 732 is connected to a wiring 733a through a terminal 731. Note that the wiring 733a may be formed using the same kind of conductive film as the conductive film of the transistor 741 or using the same kind of semiconductor film as the semiconductor film of the transistor 741.

An insulating film 720 is provided over the transistor 741 and the capacitor 742. Here, the insulating film 720 may have an opening portion reaching the conductive film 716a that serves as the source electrode of the transistor 741. A conductive film 781 is provided over the insulating film 720. The conductive film 781 may be electrically connected to the transistor 741 through the opening portion in the insulating film 720.

A partition wall 784 having an opening portion reaching the conductive film 781 is provided over the conductive film 781. A light-emitting layer 782 in contact with the conductive film 781 through the opening portion provided in the partition wall 784 is provided over the partition wall 784. A conductive film 783 is provided over the light-emitting layer 782. A region where the conductive film 781, the light-emitting layer 782, and the conductive film 783 overlap with one another serves as the light-emitting element 719.

So far, examples of the EL display device are described. Next, an example of a liquid crystal display device is described.

Figure 5A:
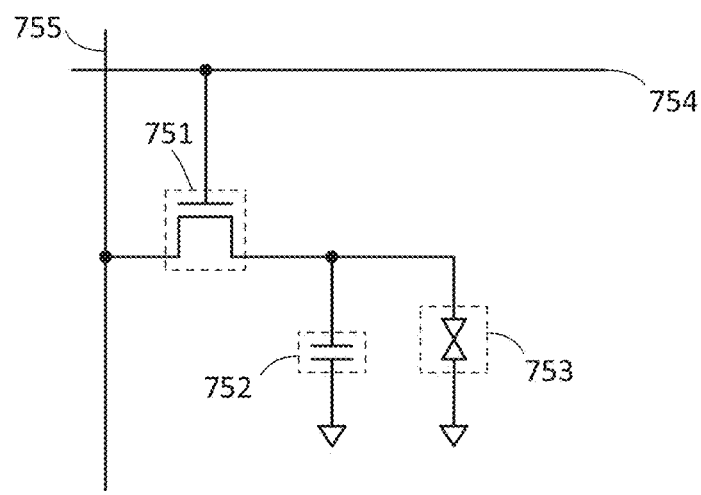
FIGS. 5A and 5B are a circuit diagram and a cross-sectional view, respectively, which illustrate an example of a display device according to one embodiment of the present invention.

FIG. 5A is a circuit diagram illustrating a configuration example of a pixel of a liquid crystal display device. A pixel shown in FIGS. 5A and 5B includes a transistor 751, a capacitor 752, and an element (liquid crystal element) 753 in which a space between a pair of electrodes is filled with a liquid crystal.

One of a source and a drain of the transistor 751 is electrically connected to a signal line 755, and a gate of the transistor 751 is electrically connected to a scan line 754.

One electrode of the capacitor 752 is electrically connected to the other of the source and the drain of the transistor 751, and the other electrode of the capacitor 752 is electrically connected to a wiring for supplying a common potential.

One electrode of the liquid crystal element 753 is electrically connected to the other of the source and the drain of the transistor 751, and the other electrode of the liquid crystal element 753 is electrically connected to a wiring to which a common potential is supplied. The common potential supplied to the wiring electrically connected to the other electrode of the capacitor 752 may be different from that supplied to the other electrode of the liquid crystal element 753.

Figure 5B:
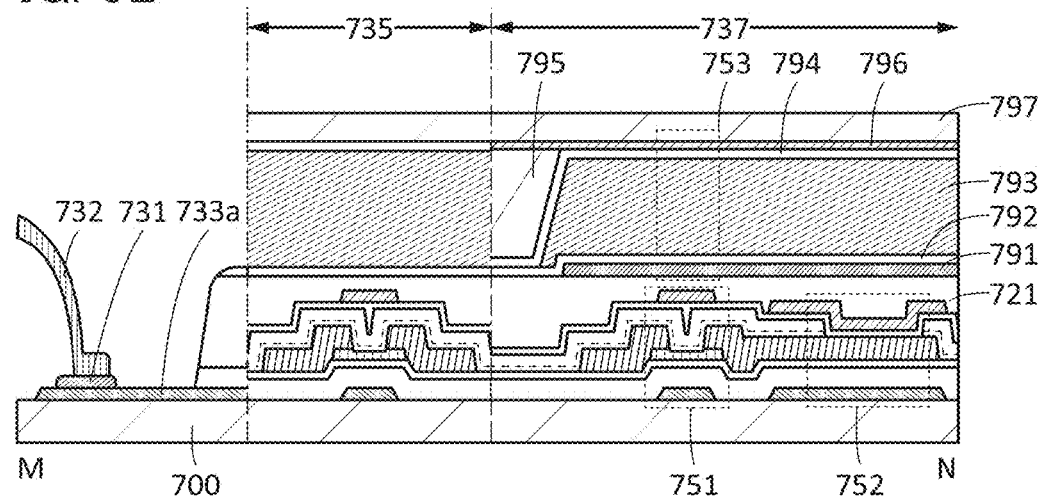

Note the description of the liquid crystal display device is made on the assumption that the top view of the liquid crystal display device is similar to that of the EL display device. FIG. 5B is a cross-sectional view of the liquid crystal display device taken along dashed-dotted line M-N in FIG. 2B. In FIG. 5B, the FPC 732 is connected to the wiring 733a via the terminal 731. Note that the wiring 733a may be formed using the same kind of conductive film as the conductive film of the transistor 751 or using the same kind of semiconductor film as the semiconductor film of the transistor 751.

For the transistor 751, the description of the transistor 741 is referred to. For the capacitor 752, the description of the capacitor 742 is referred to. Note that the structure of the capacitor 752 in FIG. 5B corresponds to, but is not limited to, the structure of the capacitor 742 in FIG. 2C. For example, the capacitor 752 may have a structure corresponding to the structure of the capacitor 742 in FIG. 3A, FIG. 3B, FIG. 4A, or FIG. 4B.

Note that in the case where an oxide semiconductor film is used as the semiconductor film of the transistor 751, the off-state current of the transistor 751 can be extremely small. Therefore, an electric charge held in the capacitor 752 is unlikely to leak, so that the voltage applied to the liquid crystal element 753 can be maintained for a long time. Accordingly, the transistor 751 can be kept off during a period in which moving images with few motions or a still image are/is displayed, whereby power for the operation of the transistor 751 can be saved in that period; accordingly a liquid crystal display device with low power consumption can be provided. Furthermore, the area occupied by the capacitor 752 can be reduced; thus, a liquid crystal display device with a high aperture ratio or a high-resolution liquid crystal display device can be provided.

An insulating film 721 is provided over the transistor 751 and the capacitor 752. The insulating film 721 has an opening portion reaching the transistor 751. A conductive film 791 is provided over the insulating film 721. The conductive film 791 is electrically connected to the transistor 751 through the opening portion in the insulating film 721.

An insulating film 792 serving as an alignment film is provided over the conductive film 791. A liquid crystal layer 793 is provided over the insulating film 792. An insulating film 794 serving as an alignment film is provided over the liquid crystal layer 793. A spacer 795 is provided over the insulating film 794. A conductive film 796 is provided over the spacer 795 and the insulating film 794. A substrate 797 is provided over the conductive film 796.

Owing to the above-described structure, a display device including a capacitor occupying a small area, a display device with high display quality, or a high-resolution display device can be provided.

<High-Resolution Display Device>

An example of a pixel included in a high-resolution EL display device is described below.

Figure 6A:
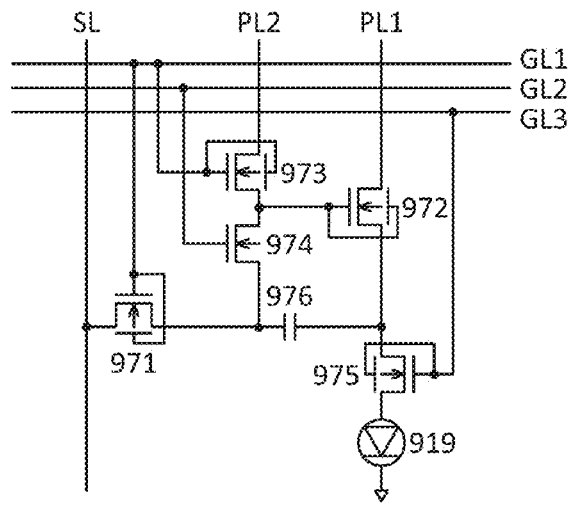
FIGS. 6A to 6C are a circuit diagram, a top view, and a cross-sectional view which illustrate an example of a display device according to one embodiment of the present invention.
Figure 6B:
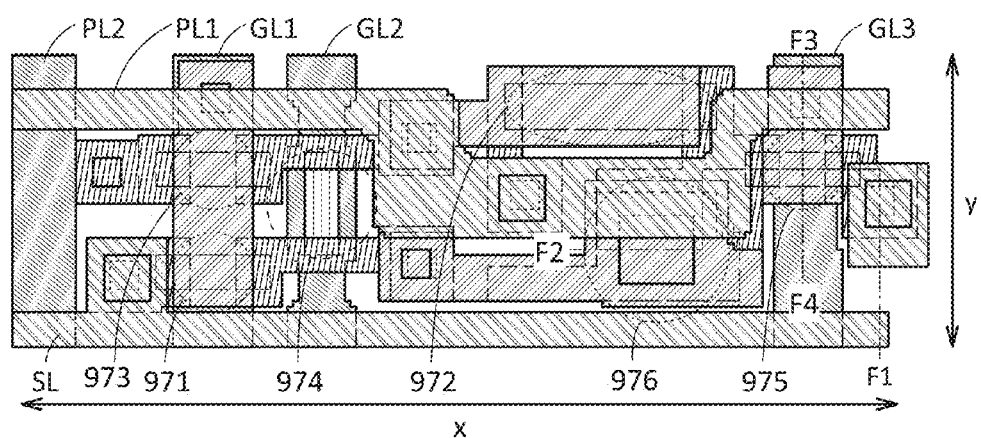
Figure 6C:
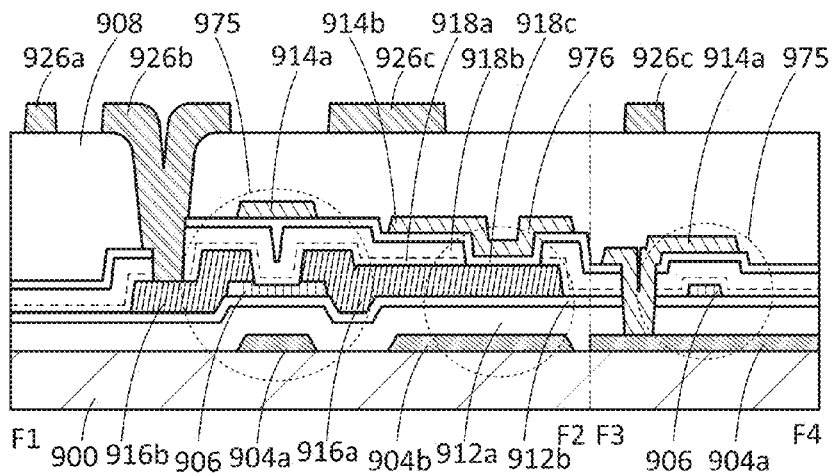

FIGS. 6A to 6C illustrate a pixel of an EL display device. The EL display device illustrated in FIGS. 6A to 6C includes a transistor 971, a transistor 972, a transistor 973, a transistor 974, a transistor 975, a capacitor 976, a light-emitting element 919, a signal line SL, a power supply line PL1, a power supply line PL2, a scan line GL1, a scan line GL2, and a scan line GL3.

The potential of a pixel electrode in the light-emitting element 919 is controlled in accordance with an image signal input to the pixel. The luminance of the light-emitting element 919 depends on a potential difference between the pixel electrode and a common electrode. Here, an anode of the light-emitting element 919 serves as a pixel electrode, and a cathode of the light-emitting element 919 serves as a common electrode.

FIG. 6A is a circuit diagram of the pixel, and the connection relation of each element and a wiring is described below.

The transistor 971 has a function of controlling a conduction state between the signal line SL and one electrode of the capacitor 976. The other electrode of the capacitor 976 is electrically connected to one of a source and a drain of the transistor 972. The transistor 973 has a function of controlling a conduction state between the power supply line PL2 and a gate of the transistor 972. The transistor 974 has a function of controlling a conduction state between one electrode of the capacitor 976 and the gate of the transistor 972. The transistor 975 has a function of controlling a conduction state between one of the source and the drain of the transistor 972 and the anode of the light-emitting element 919. The transistor 972 has a function of controlling a conduction state between the power supply line PL1 and the other electrode of the capacitor 976.

A conduction state of the transistor 971 is controlled by the potential of the scan line GL1 electrically connected to a gate of the transistor 971. A conduction state of the transistor 973 is controlled by the potential of the scan line GL1 electrically connected to a gate of the transistor 973. A conduction state of the transistor 974 is controlled by the potential of the scan line GL2 electrically connected to a gate of the transistor 974. A conduction state of the transistor 975 is controlled by the potential of the scan line GL3 electrically connected to a gate of the transistor 975.

It is preferable that an oxide semiconductor or silicon be included in the transistor 971, the transistor 972, the transistor 973, the transistor 974, and the transistor 975. It is particularly preferable that an oxide semiconductor be included in the transistor 971, the transistor 973, and the transistor 974, because the off-state current of the transistor 971, the transistor 973, and the transistor 974 can be extremely low. Furthermore, when the transistors 971, 973, and 974 having the above-described structure are used in the pixel, leakage of electric charge accumulated in the gate of the transistor 972 can be prevented more effectively compared to the case of using a transistor including a semiconductor such as silicon or germanium.

Accordingly, for example, in the case where image signals having the same image information are written to a pixel portion for some consecutive frame periods, like a still image, driving frequency can be low. In other words, display of an image can be maintained even when the number of writings of image signals to the pixel portion in a certain period is reduced. For example, by using the transistors 971, 973, and 974 including a highly purified oxide semiconductor, the write cycle of an image signal can be 10 seconds or longer, preferably 30 seconds or longer, more preferably 1 minute or longer. As the interval between writings of image signals is made longer, power consumption can be further reduced.

Furthermore, the potential of an image signal can be held for a long period. Therefore, the quality of the displayed image can be prevented from being reduced even when the capacitance of the capacitor 976 for holding the potential of the gate of the transistor 972 is small. That is, the area occupied by the capacitor 976 can be reduced; thus, the aperture ratio of the pixel can be increased. Accordingly, the lifetime of the light-emitting element 919 can be long, and the EL display device can have high reliability.

Note that in FIG. 6A, the pixel may further include another element such as a transistor, a diode, a resistor, a capacitor, or an inductor as needed.

In FIG. 6A, the transistor 971, the transistor 972, the transistor 973, and the transistor 975 each include a second gate (also referred to as back gate). In each of the transistor 971, the transistor 972, the transistor 973, and the transistor 975, the second gate is electrically connected to the gate. Therefore, drain current can be increased by an electric field applied to the second gate. Furthermore, the second gate allows a drain voltage for saturating the drain current of the transistor to be reduced. This means that the drain current can be easily made constant, so that a current can stably flow in the light-emitting element 919. Thus, the control of gray scale of the light-emitting element 919 can be facilitated, which can achieve a display device having high display quality.

Furthermore, in FIG. 6A, the transistor 974 does not have a second gate. As a result, a parasitic capacitance applied to the gate of the transistor 974 can be made small, whereby the capability to perform threshold voltage compensation in the pixel can be increased.

FIG. 6A illustrates the case where the second gate is provided in each of the transistor 971, the transistor 972, the transistor 973, and the transistor 975 and not in the transistor 974. However, one embodiment of the present invention is not limited thereto. Whether the second gate is provided or not can be selected as appropriate depending on the structure of the transistor or the like.

Note that the transistors in FIG. 6A are all n-channel transistors. In the case where the transistors in the pixel have the same channel type, a manufacturing process of the transistors can be simple as compared to the case where transistors having different channel types coexist in the pixel. Note that a structure of the EL display device according to one embodiment of the present invention is not limited to the structure in which the transistors in the pixel are all n-channel transistors.

The operation of the pixel illustrated in FIG. 6A is described with reference to FIGS. 7A and 7B and FIGS. 8A and 8B.

Figure 7A:
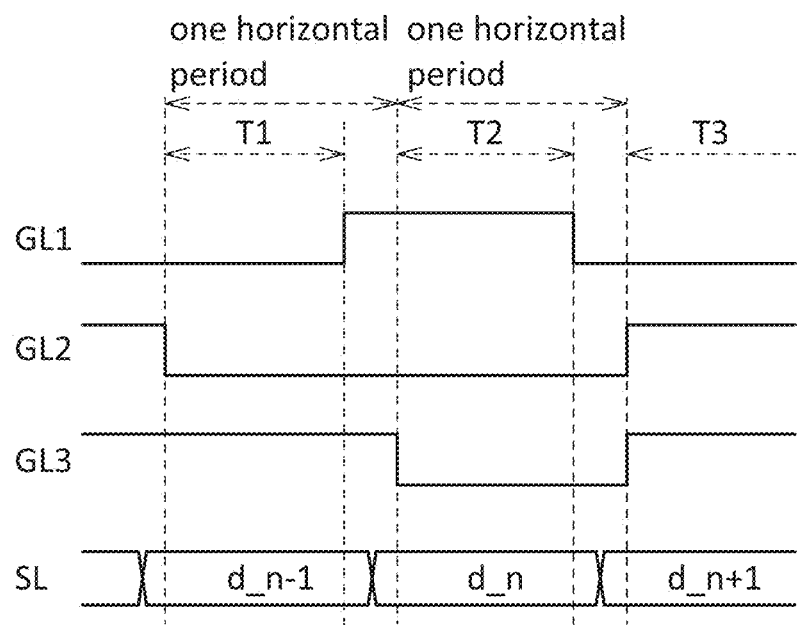
FIGS. 7A and 7B are a timing chart and a circuit diagram, respectively, which illustrate threshold voltage compensation in a pixel of a display device according to one embodiment of the present invention.
Figure 7B:
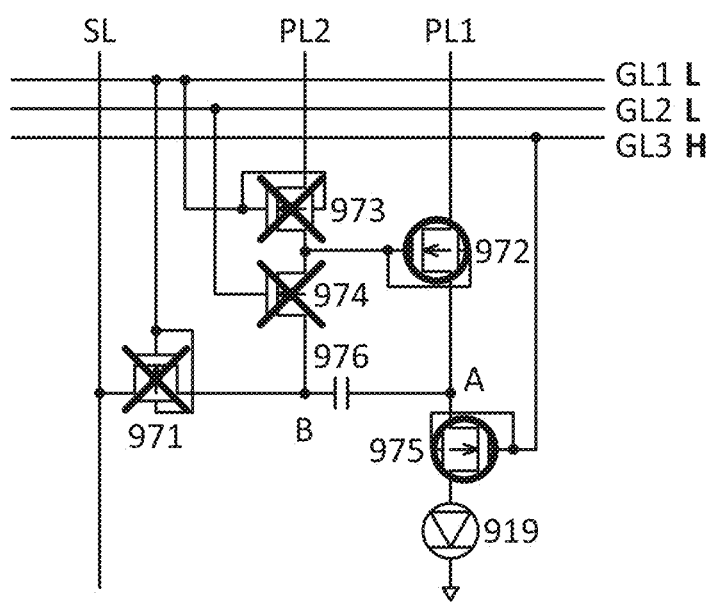

FIG. 7A is a timing chart showing the potentials of the scan lines GL1 to GL3 and the potential of the signal line SL. FIG. 7B shows the potentials of the scan lines GL1 to GL3 and the conduction states of the transistors 971 to 975 in a period T1 in FIG. 7A. In the period T1, an initialization operation is performed. Note that in FIG. 7B and FIGS. 8A and 8B, "L" and "H" represent a low-level potential and a high-level potential, respectively, applied to the scan lines GL1 to GL3.

In the period T1, a low-level potential is applied to the scan line GL1, a low-level potential is applied to the scan line GL2, and a high-level potential is applied to the scan line GL3. Thus, the transistor 975 is on, and the transistors 971, 973, and 974 are off. Note that at the start of the period T1, the transistor 972 is on in advance because of the effect of a light-emitting operation in a previous period.

A potential Vano is applied to the power supply line PL1, and a potential Vcat is applied to the cathode of the light-emitting element 919. A potential V0 is applied to the power supply line PL2, and a potential Vdata of an image signal is applied to the signal line SL. Note that the potential V0 is preferably higher than a potential that is the sum of a threshold voltage Vth of the transistor 972, a threshold voltage Vthe of the light-emitting element 919, and the potential Vcat and is preferably lower than a potential that is the sum of the threshold voltage Vth of the transistor 972 and the potential Vano.

In the period T1, the potential of a node A between the transistor 972, the transistor 975, and the capacitor 976 can be initialized to a potential close to the threshold voltage Vthe of the light-emitting element 919.

Figure 8A:
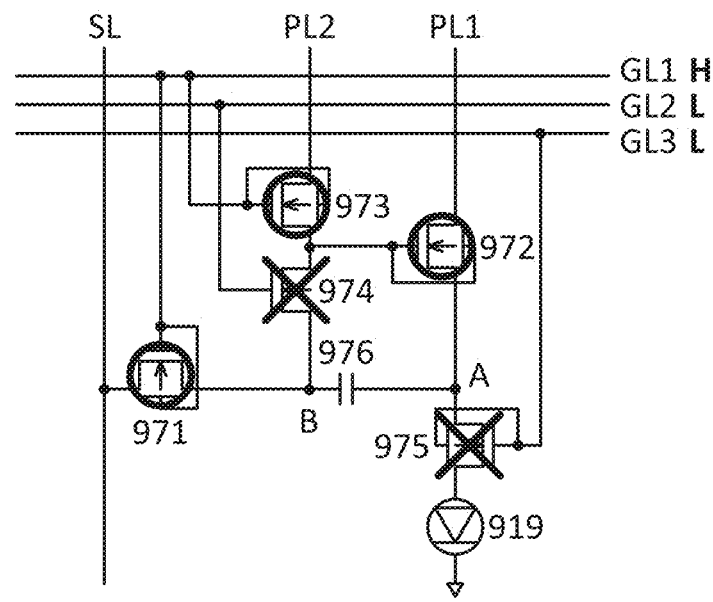
FIGS. 8A and 8B are circuit diagrams illustrating threshold voltage compensation in the pixel of the display device according to one embodiment of the present invention.

FIG. 8A shows the potentials of the scan lines GL1 to GL3 and the conduction states of the transistors 971 to 975 in a period T2 in FIG. 7A. In the period T2, the potential Vdata applied to the signal line SL and the threshold voltage Vth of the transistor 972 are acquired.

In the period T2, a high-level potential is applied to the scan line GL1, a low-level potential is applied to the scan line GL2, and a low-level potential is applied to the scan line GL3. In the period T2, the potential V0 is applied to the gate of the transistor 972. Thus, electric charge in the capacitor 976 is released via the transistor 972, and the potential of the node A, which is the potential Vcat, starts to rise. Then, when the potential of the node A becomes a potential V0–Vth, the gate voltage of the transistor 972 is decreased to the threshold voltage Vth, so that the transistor 972 is turned off. The potential Vdata is applied to the one electrode of the capacitor 976 (illustrated as "node B").

Figure 8B:
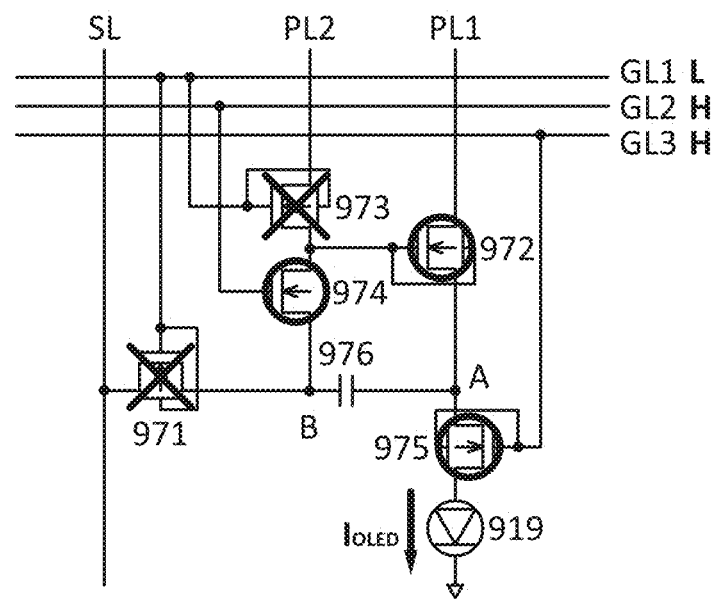

FIG. 8B shows the potentials of the scan lines GL1 to GL3 and the conduction states of the transistors 971 to 975 in a period T3 in FIG. 7A. In the period T3, light is emitted.

In the period T3, a low-level potential is applied to the scan line GL1, a high-level potential is applied to the scan line GL2, and a high-level potential is applied to the scan line GL3. In the period T3, the transistors 974 and 975 are turned on, and the transistors 971 and 973 are turned off. Note that in a transition from the period T2 to the period T3, the potentials of the scan lines GL2 and GL3 are preferably changed from low to high after the potential of the scan line GL1 is changed from high to low; thus, a change in potential of the node A due to switching of the potential of the scan line GL1 can be suppressed.

In the period T3, the potential Vdata is applied to the gate of the transistor 972 by the above operation; therefore, a gate voltage Vgs of the transistor 972 becomes (Vdata−V0+Vth). Thus, the gate voltage Vgs of the transistor 972 can be a value to which the threshold voltage Vth is added.

Specifically, when the value of a current supplied to the light-emitting element 919 is represented by $I_{OLED}$, $I_{OLED}=0.5\beta(Vgs-Vth)^2$ is satisfied. Here, β is a parameter typical of a transistor. Specifically, $\beta=(W/L)\cdot\mu_{FE}\cdot Cox$ is satisfied. Note that W is a channel width of a transistor, L is a channel length of the transistor, $\mu_{FE}$ is the field effect mobility of the transistor, and Cox is a gate capacitance of the transistor. Here, when Vgs=Vdata−V0+Vth is substituted in the equation, $I_{OLED}=0.5\beta(Vdata-V0)^2$ is given.

This means that the pixel of the EL display device illustrated in FIG. 6A has a circuit configuration which can reduce the effect of variations in threshold voltage Vth of the transistors 972 on the value of current $I_{OLED}$ to be supplied to the light-emitting element 919. Furthermore, even when the threshold voltage Vth is changed by degradation of the transistor 972, the effect of the change on the value of current $I_{OLED}$ to be supplied to the light-emitting element 919 can be reduced. Thus, a display device with less display unevenness can be provided.

Next, an example of the structure of the EL display device having a function of threshold voltage compensation which is illustrated in FIG. 6A is described with reference to FIGS. 6B and 6C. Note that in FIGS. 6B and 6C, components such as the light-emitting element 919 are not shown for easy understanding.

FIG. 6B is a top view of the pixel in the EL display device illustrated in FIG. 6A. The size of one pixel in the EL display device is expressed by x μm×y μm. For example, the size of one pixel in the EL display device can be set to 38.25 μm×12.75 μm (corresponding to 664 ppi), though it depends on a design rule.

In a pixel of such a high-resolution EL display device, when the area occupied by the capacitor 976 is not large enough, this becomes a problem in some cases. In the circuit configuration illustrated in FIG. 6A, the above-described problem can be solved by setting the capacitance of the capacitor 976 to be preferably 2 times, more preferably 5 times, still more preferably 10 times as large as the parasitic capacitance of the gate of the transistor 972.

FIG. 6C is a cross-sectional view taken along a dashed-dotted line F1-F2 and a dashed-dotted line F3-F4 in FIG. 6B.

The pixel illustrated in FIG. 6C includes a conductive film 904a and a conductive film 904b over a substrate 900; an insulating film 912a over the conductive film 904a and the conductive film 904b; an insulating film 912b over the insulating film 912a; a semiconductor film 906 that is over the insulating film 912b and overlaps with the conductive film 904a; a conductive film 916a and a conductive film 916b in contact with the semiconductor film 906; an insulating film 918a over the semiconductor film 906, the conductive film 916a, and the conductive film 916b; an insulating film 918b over the insulating film 918a; an insulating film 918c over the insulating film 918b; a conductive film 914a that is over the insulating film 918c and overlaps with the semiconductor film 906; a conductive film 914b that is over the insulating film 918c and overlaps with the conductive film 916b; an insulating film 908 over the insulating film 918c, the conductive film 914a, and the conductive film 914b; and a conductive film 926a, a conductive film 926b, and a conductive film 926c over the insulating film 908.

Note that the conductive film 926b is electrically connected to the conductive film 916b through an opening portion in the insulating film 918a, the insulating film 918b, the insulating film 918c, and the insulating film 908. The conductive film 914a is electrically connected to the conductive film 904a through an opening portion in the insulating film 912a, the insulating film 912b, the insulating film 918a, the insulating film 918b, and the insulating film 918c. The insulating film 918a and the insulating film 918b have an opening portion over a part of the conductive film 916a, and the conductive film 916a and the insulating film 918c are in contact with each other in the opening portion.

In the transistor 975, the conductive film 904a serves as a gate electrode; the insulating film 912a and the insulating film 912b serve as a gate insulating film; the conductive film 916a serves as a source electrode; the conductive film 916b serves as a drain electrode; the insulating film 918a, the insulating film 918b, and the insulating film 918c serve as a gate insulating film; and the conductive film 914a serves as a gate electrode.

In the capacitor 976, the conductive film 904b and the conductive film 914b each serve as one electrode, and the conductive film 916a serves as the other electrode.

Note that the transistor 975 has a structure similar to that of the transistor 741. Therefore, for the transistor 975, the description of the transistor 741 is referred to. The description of the transistor 741 is referred to also for the transistors 971, 972, 973, and 974. The capacitor 976 has a structure similar to that of the capacitor 742. Therefore, for the capacitor 976, the description of the capacitor 742 is referred to.

In the pixel illustrated in FIGS. 6B and 6C, the area occupied by the capacitor 976 can be small; thus, the pixel is suitable for a high-resolution EL display device.

Next, a method for forming a layer structure of the pixel illustrated in FIGS. 6B and 6C is described with reference to FIGS. 9A and 9B, FIGS. 10A and 10B, FIGS. 11A and 11B, FIGS. 12A and 12B, FIGS. 13A and 13B, FIGS. 14A and 14B, FIGS. 15A and 15B, and FIGS. 16A and 16B. Note that top views are shown in FIG. 9A, FIG. 10A, FIG. 11A, FIG. 12A, FIG. 13A, FIG. 14A, FIG. 15A, and FIG. 16A, and cross-sectional views corresponding to the respective top views are shown in FIG. 9B, FIG. 10B, FIG. 11B, FIG. 12B, FIG. 13B, FIG. 14B, FIG. 15B, and FIG. 16B.

Figure 9A:
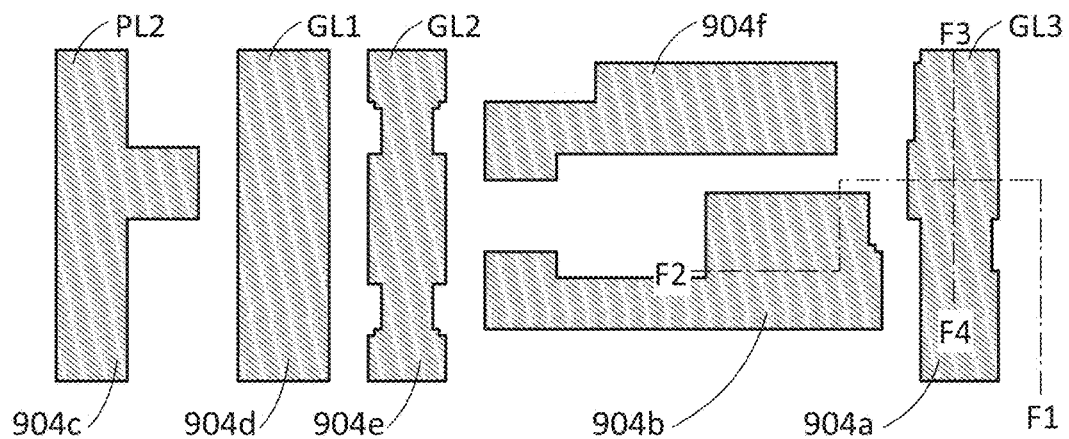
FIGS. 9A and 9B are a top view and a cross-sectional view, respectively, which illustrate an example of a method for manufacturing a display device according to one embodiment of the present invention.
Figure 9B:
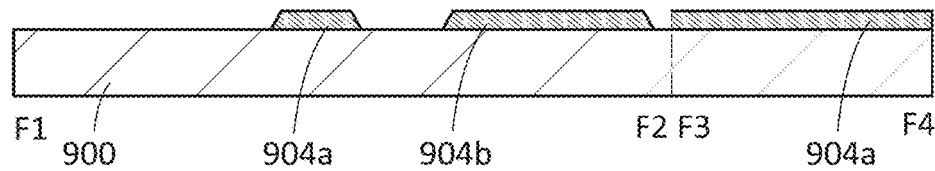

First, the conductive film 904a, the conductive film 904b, a conductive film 904c, a conductive film 904d, a conductive film 904e, and a conductive film 904f are formed over the substrate 900 (see FIGS. 9A and 9B). Note that the conductive film 904a serves as the scan line GL3 and the gate electrode of the transistor 975. The conductive film 904b serves as one electrode of the capacitor 976. The conductive film 904c serves as the power supply line PL2. The conductive film 904d serves as the scan line GL1 and a gate electrode of each of the transistor 971 and the transistor 973. The conductive film 904e serves as the scan line GL2 and a gate electrode of the transistor 974. The conductive film 904f serves as a gate electrode of the transistor 972.

Next, the insulating film 912a is formed. The insulating film 912b is formed over the insulating film 912a. Note that the insulating film 912a and the insulating film 912b serve as a gate insulating film of each of the transistor 971, the transistor 972, the transistor 973, the transistor 974, and the transistor 975.

Figure 10A:
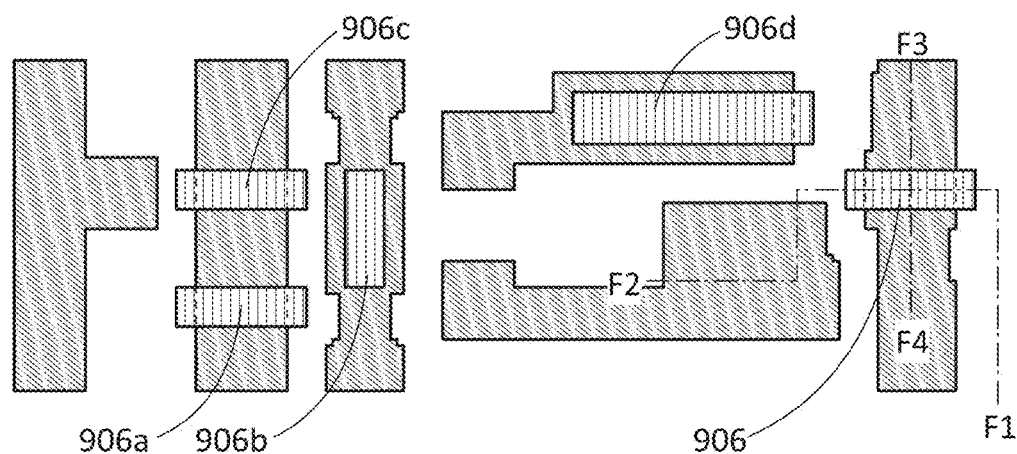
FIGS. 10A and 10B are a top view and a cross-sectional view, respectively, which illustrate the example of the method for manufacturing the display device according to one embodiment of the present invention.
Figure 10B:
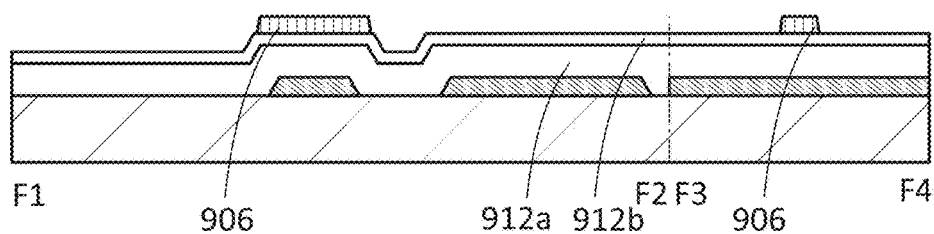

Next, the semiconductor film 906, and a semiconductor film 906a, a semiconductor film 906b, a semiconductor film 906c, and a semiconductor film 906d in the same layer as the semiconductor film 906 are formed (see FIGS. 10A and 10B). The semiconductor film 906 serves as a semiconductor film of the transistor 975. The semiconductor film 906a serves as a semiconductor film of the transistor 971. The semiconductor film 906b serves as a semiconductor film of the transistor 974. The semiconductor film 906c serves as a semiconductor film of the transistor 973. The semiconductor film 906d serves as a semiconductor film of the transistor 972.

Figure 11A:
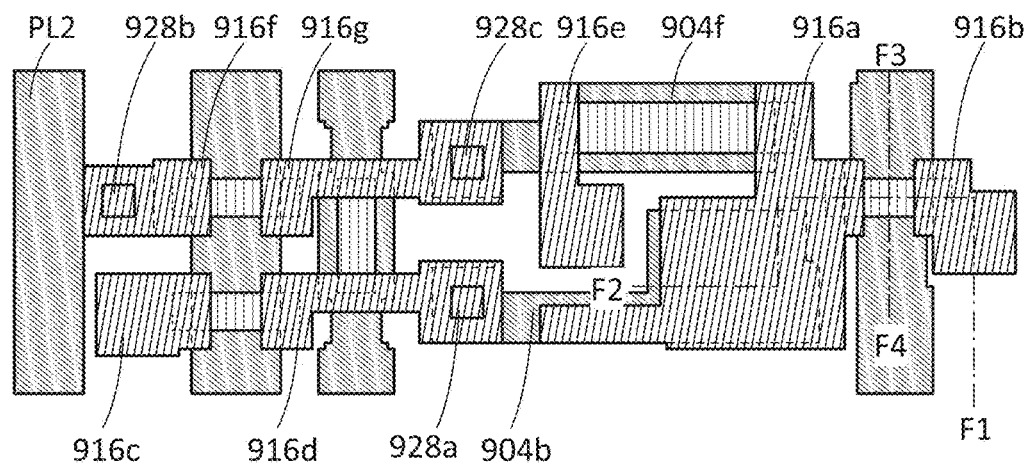
FIGS. 11A and 11B are a top view and a cross-sectional view, respectively, which illustrate the example of the method for manufacturing the display device according to one embodiment of the present invention.
Figure 11B:
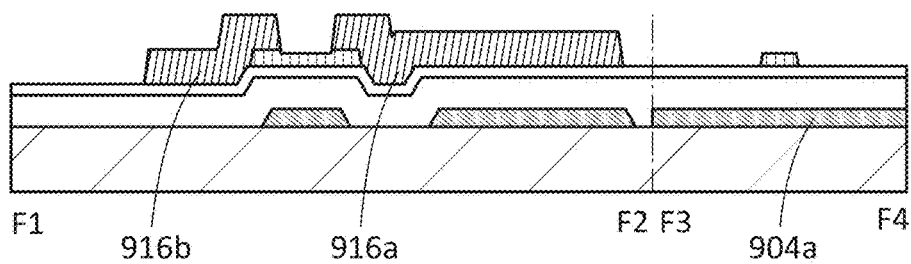
Figure 12A:
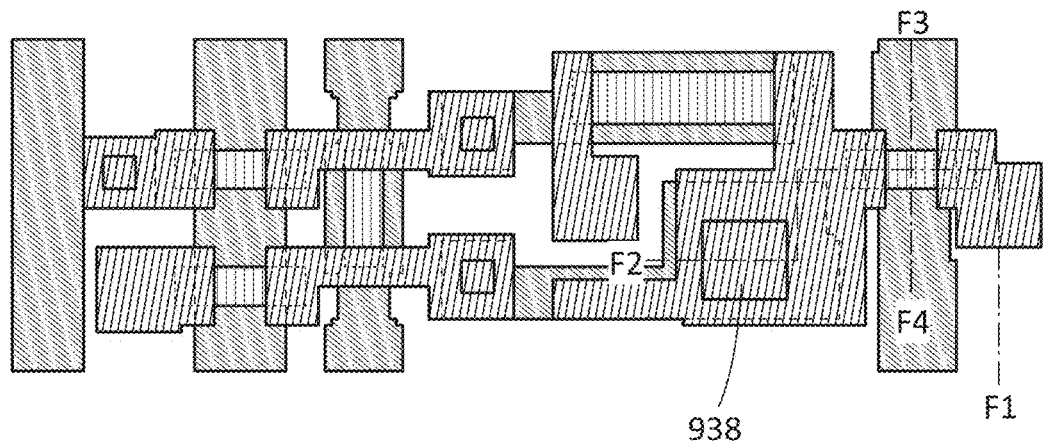
FIGS. 12A and 12B are a top view and a cross-sectional view, respectively, which illustrate the example of the method for manufacturing the display device according to one embodiment of the present invention.
Figure 12B:
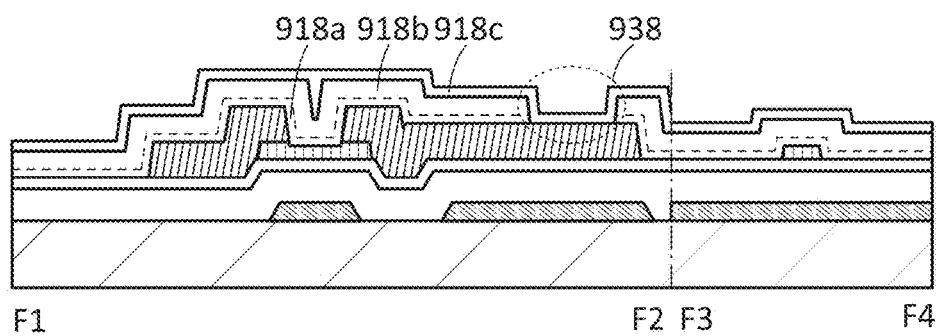
Figure 13A:
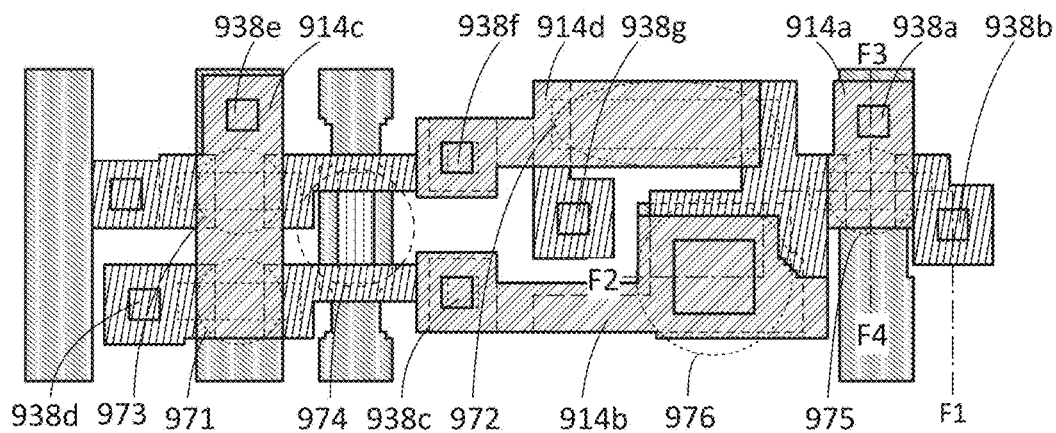
FIGS. 13A and 13B are a top view and a cross-sectional view, respectively, which illustrate the example of the method for manufacturing the display device according to one embodiment of the present invention.
Figure 13B:
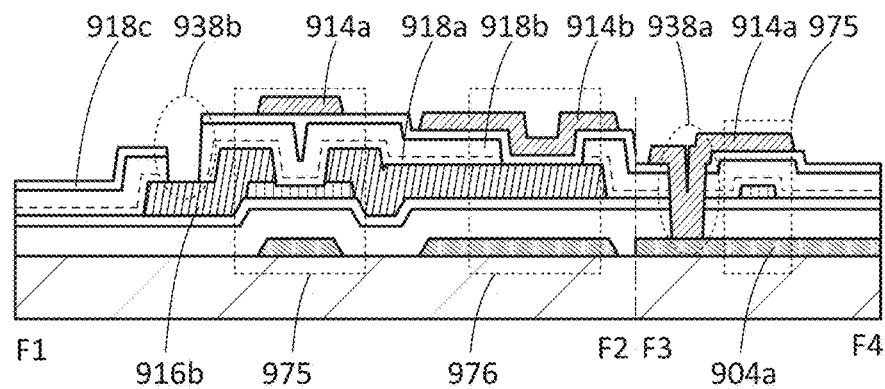

Next, an opening portion 928a that reaches the conductive film 904b, an opening portion 928b that reaches the conductive film 904c, and an opening portion 928c that reaches the conductive film 904f are formed in the insulating film 912a and the insulating film 912b (see FIGS. 11A and 11B).

Next, the conductive film 916a, the conductive film 916b, a conductive film 916c, a conductive film 916d, a conductive film 916e, a conductive film 916f, and a conductive film 916g are formed. The conductive film 916d is electrically connected to the conductive film 904b through the opening portion 928a. The conductive film 916f is electrically connected to the conductive film 904c through the opening portion 928b. The conductive film 916g is electrically connected to the conductive film 904f through the opening portion 928c (see FIGS. 11A and 11B). The conductive film 916a serves as a source electrode of the transistor 972, the drain electrode of the transistor 975, and the other electrode of the capacitor 976. The conductive film 916b serves as the source electrode of the transistor 975. The conductive film 916c serves as a source electrode or a drain electrode of the transistor 971. The conductive film 916d serves as the source electrode or the drain electrode of the transistor 971 and a source electrode or a drain electrode of the transistor 974. The conductive film 916e serves as a drain electrode of the transistor 972. The conductive film 916f serves as a source electrode or a drain electrode of the transistor 973. The conductive film 916g serves as the source electrode or the drain electrode of the transistor 973 and the source electrode or the drain electrode of the transistor 974.

The insulating film 918a is formed. Next, the insulating film 918b is formed. An opening portion 938 that reaches the conductive film 916a is formed in the insulating film 918a and the insulating film 918b. The insulating film 918c is formed (see FIGS. 12A and 12B). Note that the insulating film 918a, the insulating film 918b, and the insulating film 918c collectively serve as a gate insulating film of each of the transistor 971, the transistor 972, the transistor 973, the transistor 974, and the transistor 975.

Next, an opening portion 938b that reaches the conductive film 916b, an opening portion 938c that reaches the conductive film 916d, an opening portion 938d that reaches the conductive film 916c, an opening portion 938f that reaches the conductive film 916g, and an opening portion 938g that reaches the conductive film 916e are formed in the insulating film 918a, the insulating film 918b, and the insulating film 918c. Furthermore, an opening portion 938a that reaches the conductive film 904a is formed in the insulating film 912a, the insulating film 912b, the insulating film 918a, the insulating film 918b, and the insulating film 918c (see FIGS. 13A and 13B).

Next, the conductive film 914a, the conductive film 914b, a conductive film 914c, and a conductive film 914d are formed. The conductive film 914a is electrically connected to the conductive film 904a through the opening portion 938a. The conductive film 914b is electrically connected to the conductive film 916d through the opening portion 938c. As described above, the conductive film 916d is electrically connected to the conductive film 904b. Thus, the conductive film 914b is electrically connected to the conductive film 904b. The conductive film 914c is electrically connected to the conductive film 904d through the opening portion 938e. The conductive film 914d is electrically connected to the conductive film 916g through the opening portion 938f. As described above, the conductive film 916g is electrically connected to the conductive film 904f. Thus, the conductive film 914d is electrically connected to the conductive film 904f. The conductive film 914a serves as the gate electrode of the transistor 975. The conductive film 914b serves as one electrode of the capacitor 976. The conductive film 914c serves as a gate electrode of each of the transistor 971 and the transistor 973. The conductive film 914d serves as a gate electrode of the transistor 972.

Next, the insulating film 908 is formed. Next, an opening portion 948a overlapping with the opening portion 938b, an opening portion 948b overlapping with the opening portion 938g, and an opening portion 948c overlapping with the opening portion 938d are formed in the insulating film 908 (see FIGS. 14A and 14B).

Next, the conductive film 926a, the conductive film 926b, and the conductive film 926c are formed. The conductive film 926a is electrically connected to the conductive film 916c through the opening portion 948c. The conductive film 926b is electrically connected to the conductive film 916b through the opening portion 948a. The conductive film 926c is electrically connected to the conductive film 916e through the opening portion 948b. Note that the conductive film 926a serves as a signal line. The conductive film 926c serves as the power supply line PL1.

Figure 14A:
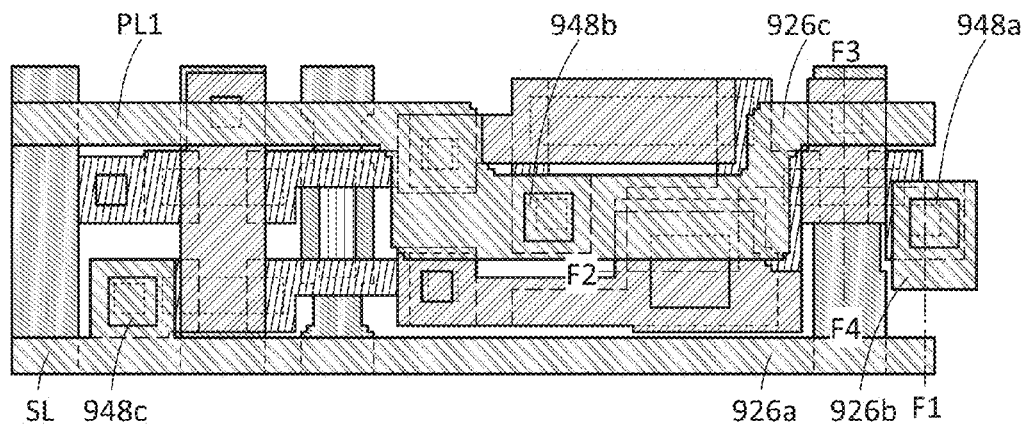
FIGS. 14A and 14B are a top view and a cross-sectional view, respectively, which illustrate the example of the method for manufacturing the display device according to one embodiment of the present invention.
Figure 14B:
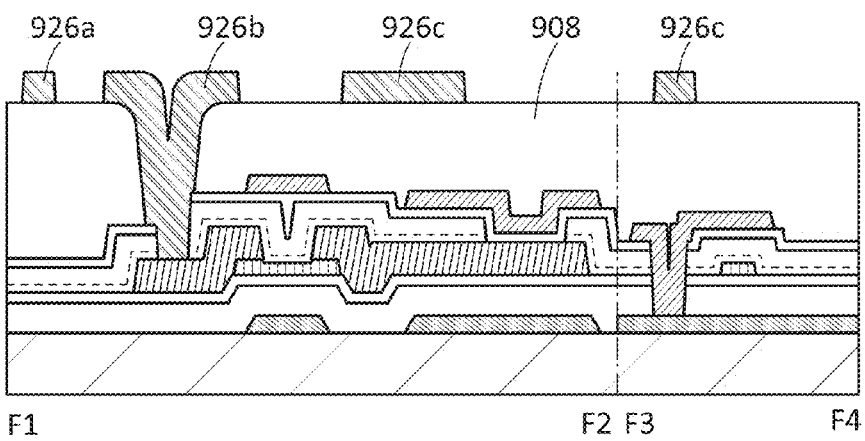
Figure 15A:
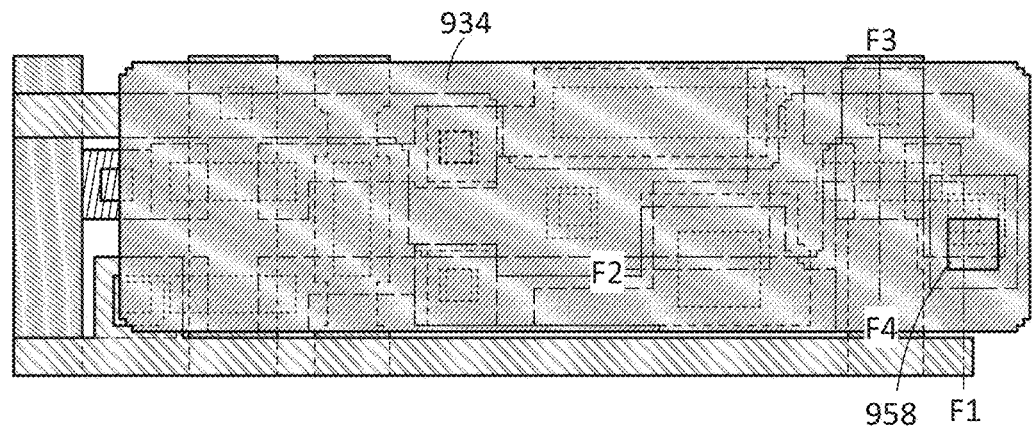
FIGS. 15A and 15B are a top view and a cross-sectional view, respectively, which illustrate the example of the method for manufacturing the display device according to one embodiment of the present invention.
Figure 15B:
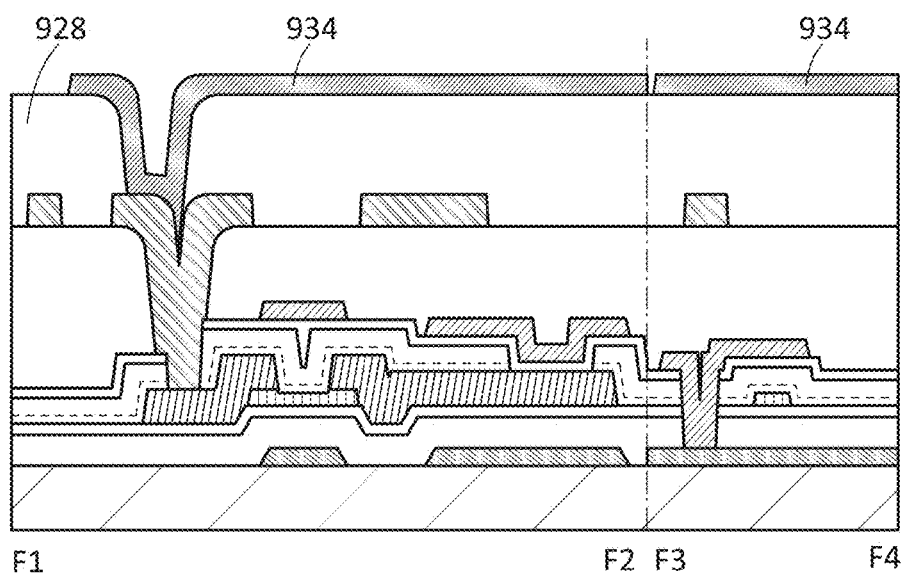

FIGS. 14A and 14B correspond to FIGS. 6B and 6C. Subsequent steps of FIGS. 14A and 14B in the method for manufacturing an EL display device are described with reference to FIGS. 15A and 15B and FIGS. 16A and 16B.

An insulating film 928 is formed over the insulating film 908, the conductive film 926a, the conductive film 926b, and the conductive film 926c. Next, an opening portion 958 that reaches the conductive film 926b is formed in the insulating film 928 (see FIGS. 15A and 15B).

Next, a conductive film 934 is formed. The conductive film 934 is electrically connected to the conductive film 926b through the opening portion 958 (see FIGS. 15A and 15B). Note that the conductive film 934 serves as one electrode of the light-emitting element 919.

Figure 16A:
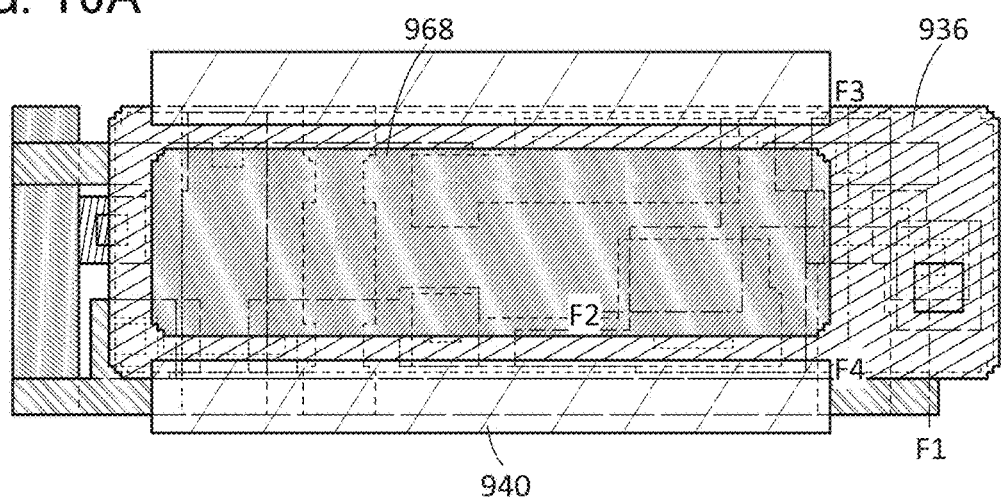
FIGS. 16A and 16B are a top view and a cross-sectional view, respectively, which illustrate the example of the method for manufacturing the display device according to one embodiment of the present invention.
Figure 16B:
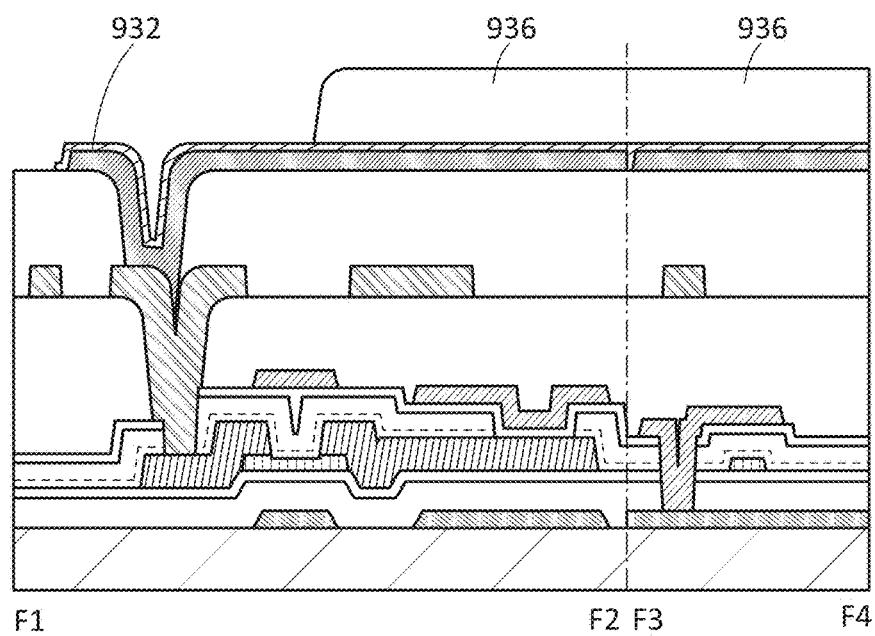

Next, a transparent film 932 having a function of transmitting or semi-transmitting visible light is formed (see FIGS. 16A and 16B). Owing to the transparent film 932, a micro optical resonator (microcavity) which utilizes a light resonant effect can be formed, whereby a peak of a spectrum of light emitted from the light-emitting element 919 can be sharp and have high intensity. Thus, the EL display device including the transparent film 932 can emit light with high luminance and high color purity. Note that the thickness (the number of layers) or the kind of the transparent film 932 preferably depends on the light emission color of the pixel. Note that the transparent film 932 is not necessarily formed.

Then, an insulating film 936 is formed. The insulating film 936 includes an opening portion 968 which is to be a light emission region of the pixel (see FIGS. 16A and 16B). The insulating film 936 serves as a partition wall.

Next, a spacer 940 is formed (see FIGS. 16A and 16B).

Then, a light-emitting layer, a conductive film that serves as the other electrode of the light-emitting element 919, and the like are formed. Thus, the EL display device can be manufactured. The EL display device has high resolution and high display quality.

The value of the gate voltage Vgs of the transistor 972 in the period T3 of the pixel illustrated in FIG. 7A was obtained by calculation. The calculation was performed using Smartspice, an analog circuit simulator, and Clever, an RC Extractor for Realistic 3D structures, which are manufactured by Silvaco, Inc.

First, a parasitic capacitance in the pixel was extracted using Clever. Table 1 shows the thickness of each film used for parasitic capacitance extraction.

TABLE 1

| | Material of film | Thickness [nm] | Relative permittivity |
|---|---|---|---|
| Conductive films 904a to 904f | W | 200 | — |
| Insulating film 912a | SiN | 400 | 7 |
| Insulating film 912b | SiON | 50 | 4 |
| Semiconductor films 906, 906a to 906d | In—Ga—Zn oxide | 35 | 15 |
| Conductive films 916a to 916g | W\Al\Ti | 50\400\100 | — |
| Insulating films 918a + 918b | SiON | 450 | 4 |
| Insulating film 918c | SiN | 100 | 7 |
| Conductive films 914a to 914d | In—Sn—Si oxide | 100 | — |
| Insulating film 908 | Polyimide | 1800 | 4 |
| Conductive films 926a to 926c | Ti\Al\Ti | 100\400\100 | — |
| Insulating film 928 | Polyimide | 1800 | 4 |
| Conductive film 934 | Ti\Al\Ti | 50\200\5 | — |

Calculation for the parasitic capacitance extraction was performed until the error of repeated calculations fell within 5%. A Manhattan type of a geometrical mode was used for a 3D structure. The circuit includes a matrix of 3×3 pixels.

To calculate the value of the gate voltage Vgs of the transistor 972 of the pixel in the period T3 illustrated in FIG. 7A, a difference between the potential Vdata applied to the signal line SL and the potential V0 applied to the power supply line PL2 (i.e., Vdata−V0) was set to −1 V (condition 1), −0.5 V (condition 2), 0 V (condition 3), 0.5 V (condition 4), 1 V (condition 5), or 1.5 V (condition 6). The potential values of wirings under the conditions 1 to 6 were as follows: the potential Vano applied to the power supply line PL1 was 10 V; the potential Vcat of the other electrode of the light-emitting element 919 was −4 V; a potential GVDD was 15 V; and a potential GVSS was −5 V. The potential GVDD corresponds to a high-level potential applied to the scan lines GL1, GL2, and GL3. The potential GVSS corresponds to a low-level potential applied to the scan lines GL1, GL2, and GL3.

For the calculation, the channel length L and the channel width W of the transistor 971 were set to 2 μm and 1.5 μm, respectively; the channel length L and the channel width W of the transistor 972 were set to 6 μm and 2 μm, respectively; the channel length L and the channel width W of the transistor 973 were set to 2 μm and 1.5 μm, respectively; the channel length L and the channel width W of the transistor 974 were set to 3 μm and 1.5 μm, respectively; and the channel length L and the channel width W of the transistor 975 were set to 2 μm and 2 μm, respectively. The length in the channel length direction of a region in which a region where the gate electrode is formed overlaps with a region where the conductive film serving as the source electrode or the drain electrode is in contact with the semiconductor film in all the transistors included in the pixel in FIGS. 6A to 6C was 0.75 μm.

The gate voltage Vgs of the transistor 972 in the period T3 is expressed by (Vdata−V0+Vth). Thus, the equation Vgs−Vth=Vdata−V0 holds in the pixel in FIGS. 6A to 6C, so that (Vgs−Vth) is ideally constant regardless of the value of the threshold voltage Vth.

FIG. 17 shows the relationship between threshold voltage Vth and (Vgs−Vth) obtained by the calculation under the conditions 1 to 6. In FIG. 17, the horizontal axis represents threshold voltage "Vth (V)" and the vertical axis represents "(Vgs−Vth) (V)". FIG. 17 shows that, even when the value of the threshold voltage Vth is changed, the variation in (Vgs−Vth) due to the change is limited to approximately 45% with respect to the case without threshold voltage compensation (dashed line in FIG. 17).

The results of the above-described calculation show that, in the EL display device according to one embodiment of the present invention, even when the threshold voltage Vth of the transistor 972 varies or changes, the gate voltage Vgs of the transistor 972 can be compensated to a gate voltage Vgs that is less affected by the variation or the change.

<Driver Circuit>

Figure 22:
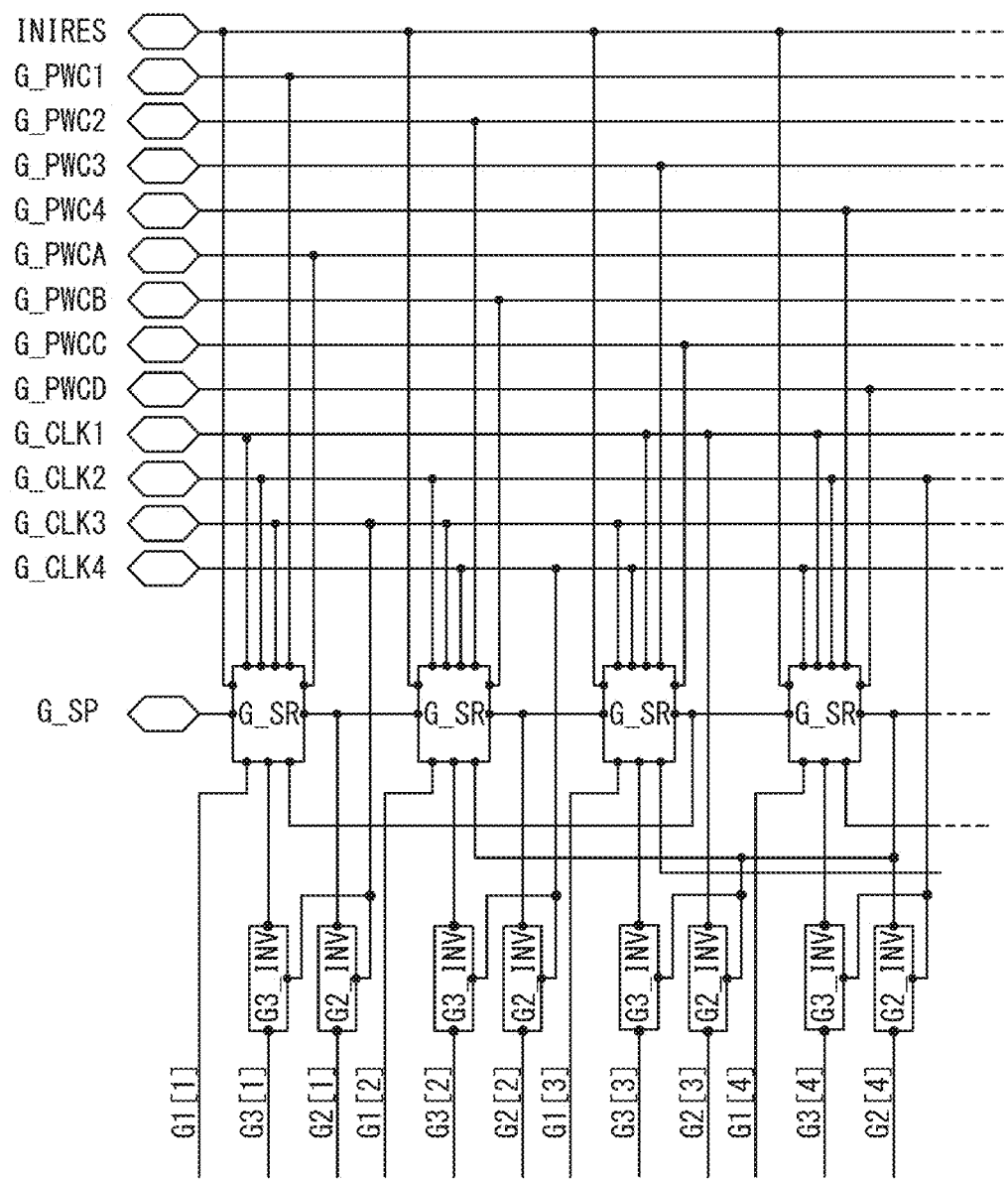
FIG. 22 is a circuit diagram of a scan line driver circuit according to one embodiment of the present invention.
Figure 23A:
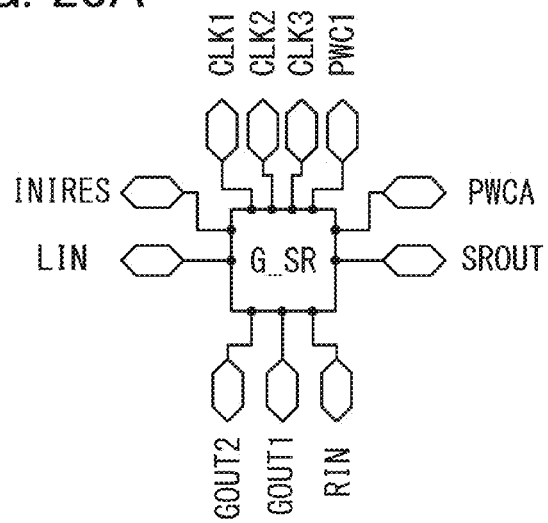
FIGS. 23A to 23C each show a connection relation in a scan line driver circuit.
Figure 23B:
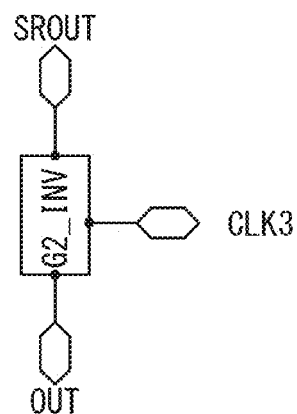
Figure 23C:
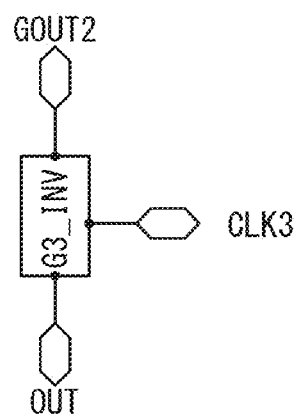

FIG. 22 is an example of a scan line driver circuit applicable to a display device according to one embodiment of the present invention. FIG. 23A, FIG. 23B, and FIG. 23C schematically show a shift register (also referred to as G_SR), positions of terminals of an inverter (also referred to as G2_INV) connected to a wiring G2, and positions of terminals of an inverter (also referred to as G3_INV) connected to a wiring G3, respectively, which are components of the scan line driver circuit.

Figure 24:
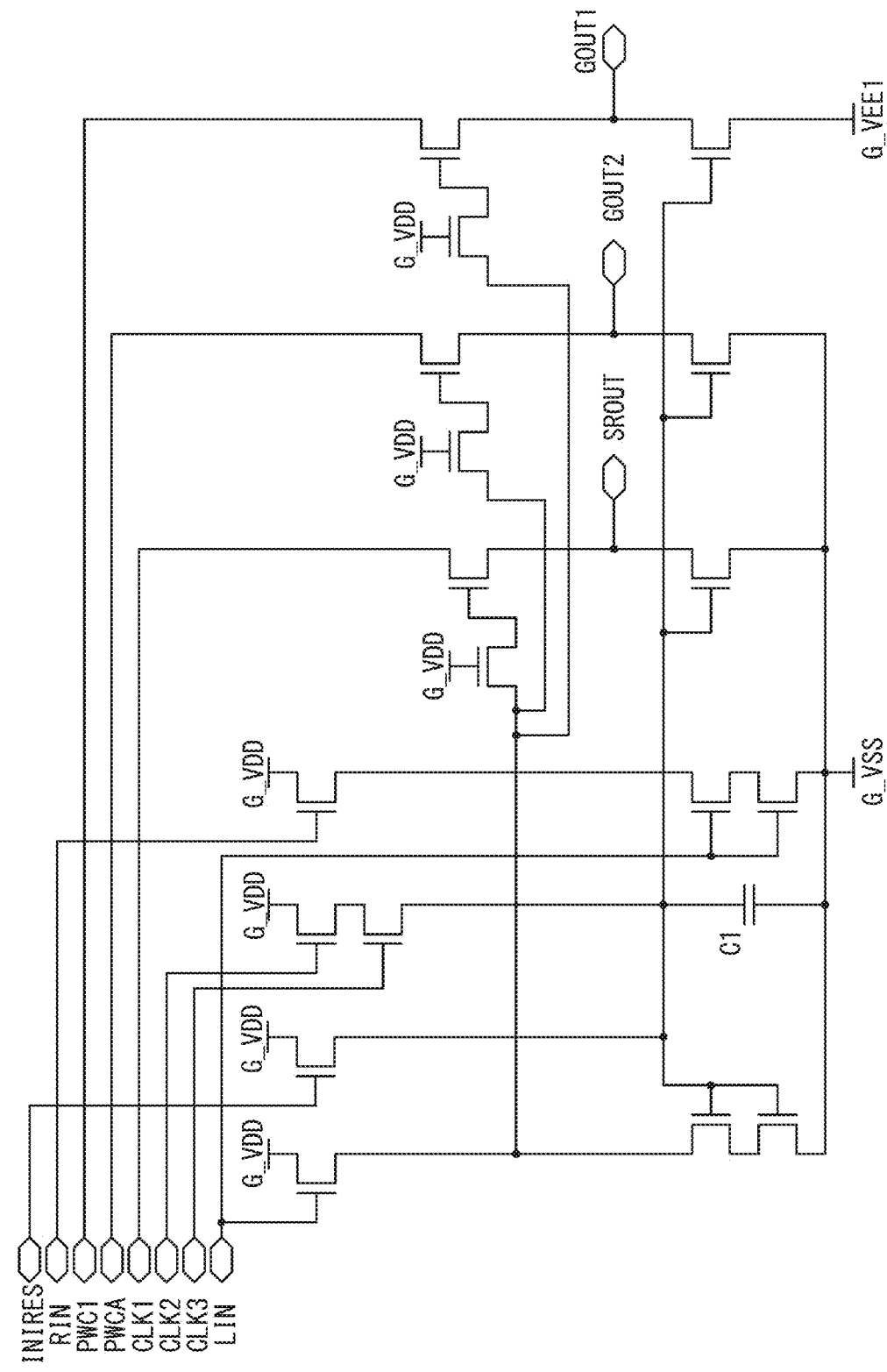
FIG. 24 is a circuit diagram of a shift register according to one embodiment of the present invention.
Figure 25:
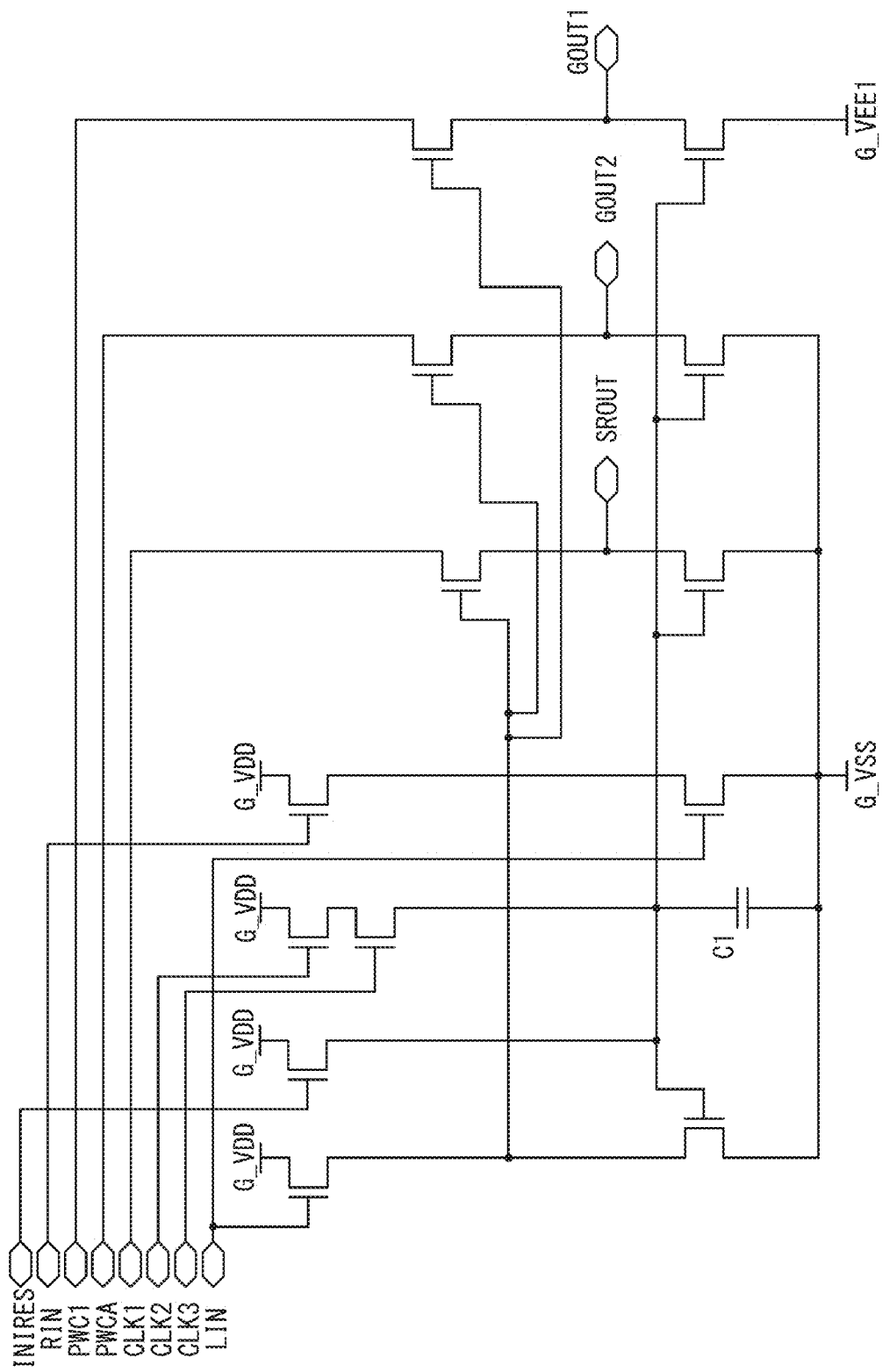
FIG. 25 is a circuit diagram of a shift register according to one embodiment of the present invention.
Figure 26:
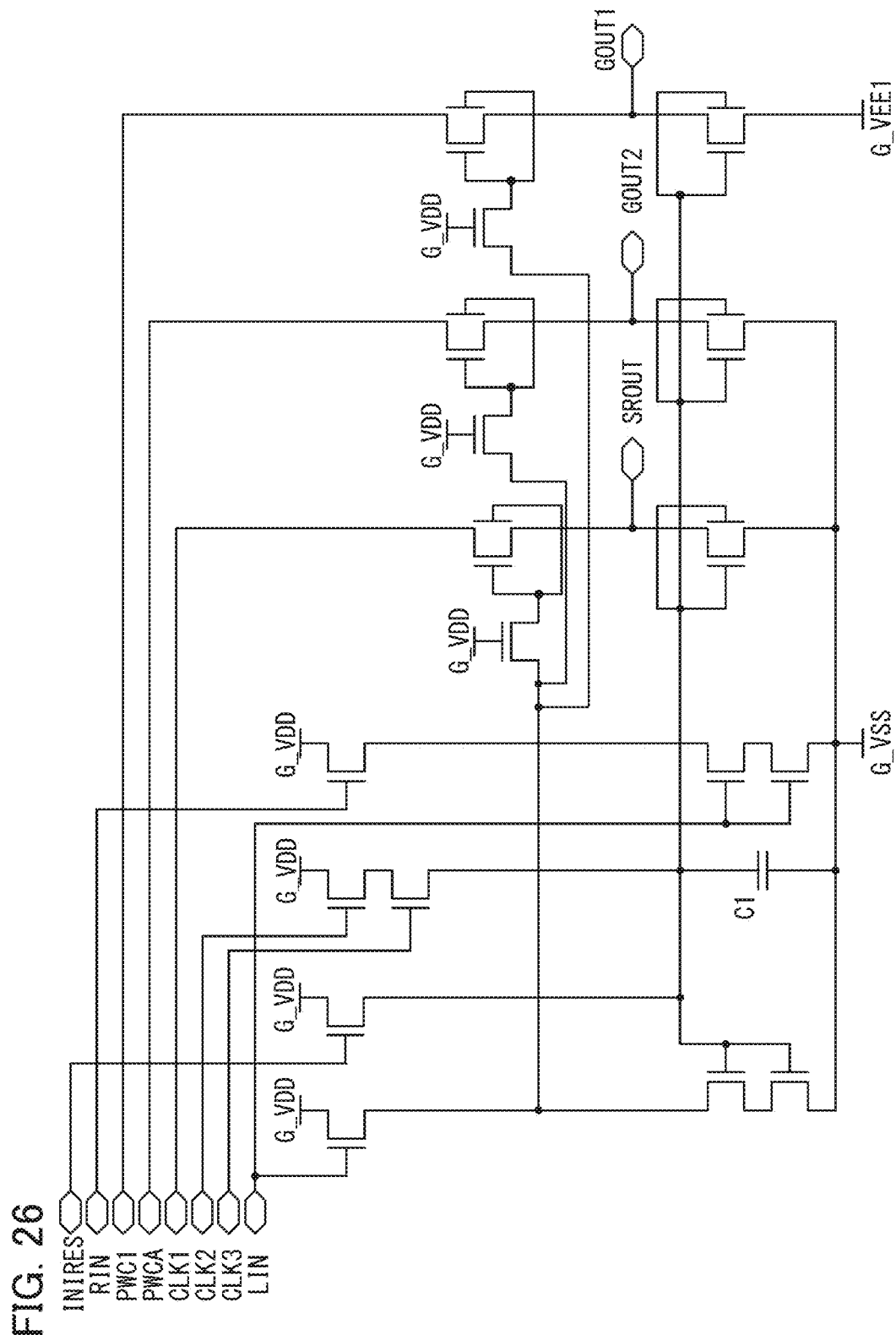
FIG. 26 is a circuit diagram of a shift register according to one embodiment of the present invention.
Figure 27:
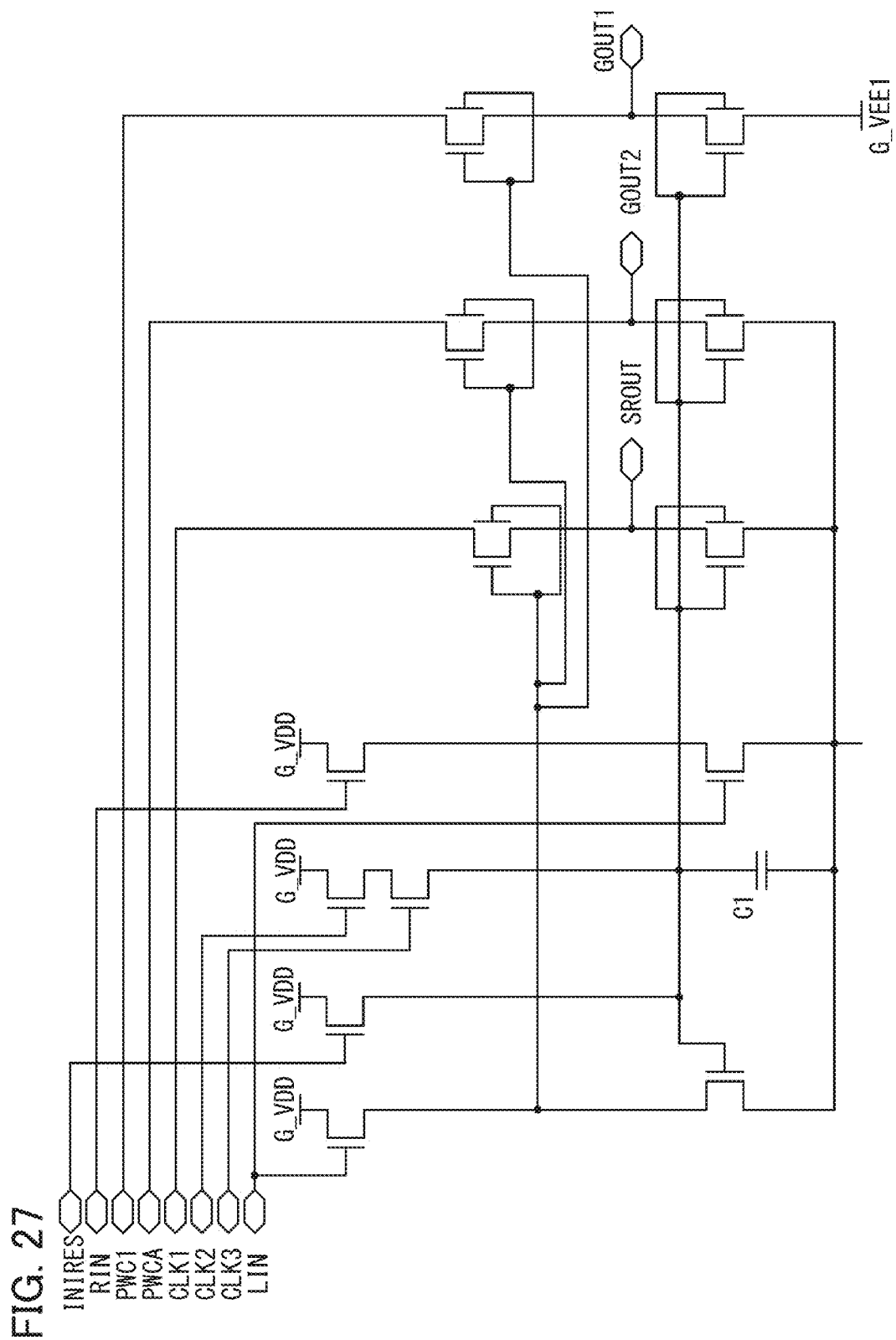
FIG. 27 is a circuit diagram of a shift register according to one embodiment of the present invention.
Figure 28A:
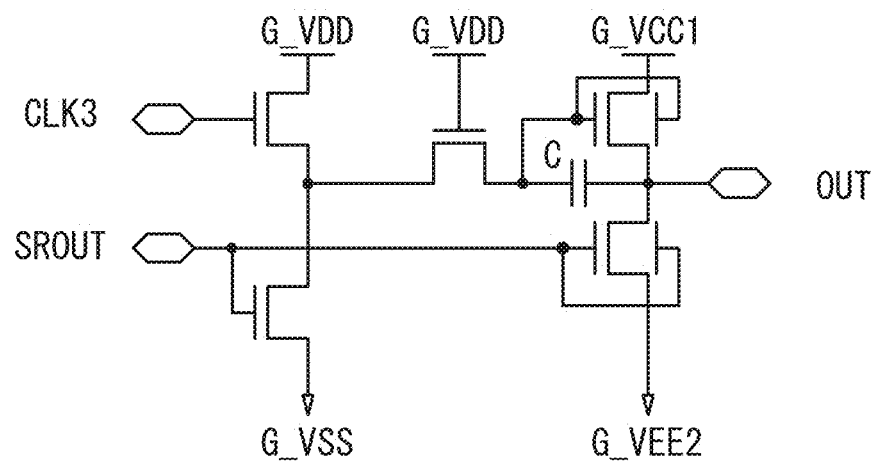
FIGS. 28A and 28B are each a circuit diagram of an inverter according to one embodiment of the present invention.
Figure 28B:
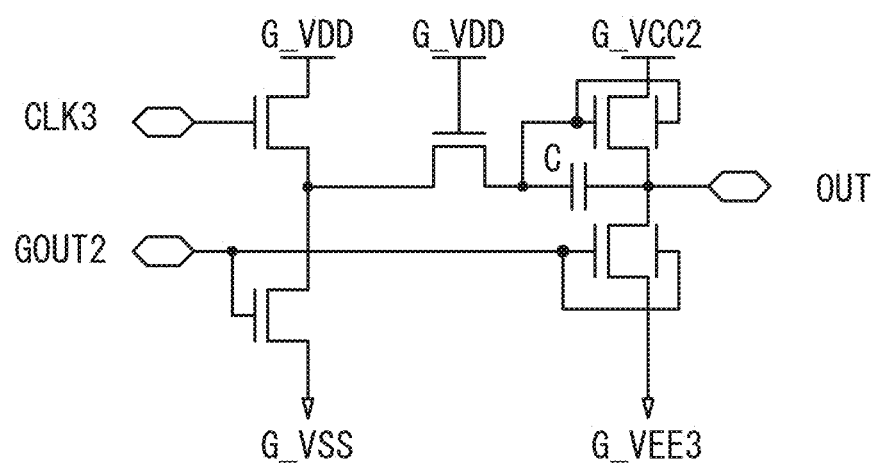

FIGS. 24 and 25 are each a diagram of a circuit which can be used as the shift register shown in FIG. 23A. In each circuit, a transistor may have a second gate electrode as shown in FIGS. 26 and 27. Note that in FIGS. 26 and 27, the second gate electrode is electrically connected to a first gate electrode. Such a transistor has a higher on-state current than that of a transistor of the same size that does not have the second gate electrode. Thus, even when the voltage amplitude of an output signal is high, the area occupied by the scan line driver circuit can be small. FIGS. 28A and 28B illustrate a circuit which can be used as the inverter connected to the wiring G2 and a circuit which can be used as the inverter connected to the wiring G3, respectively. Note that G_VDD, G_VCC1, and G_VCC2 are high power supply potentials, and G_VSS, G_VEE1, G_VEE2, and G_VEE3 are low power supply potentials.

Figure 29:
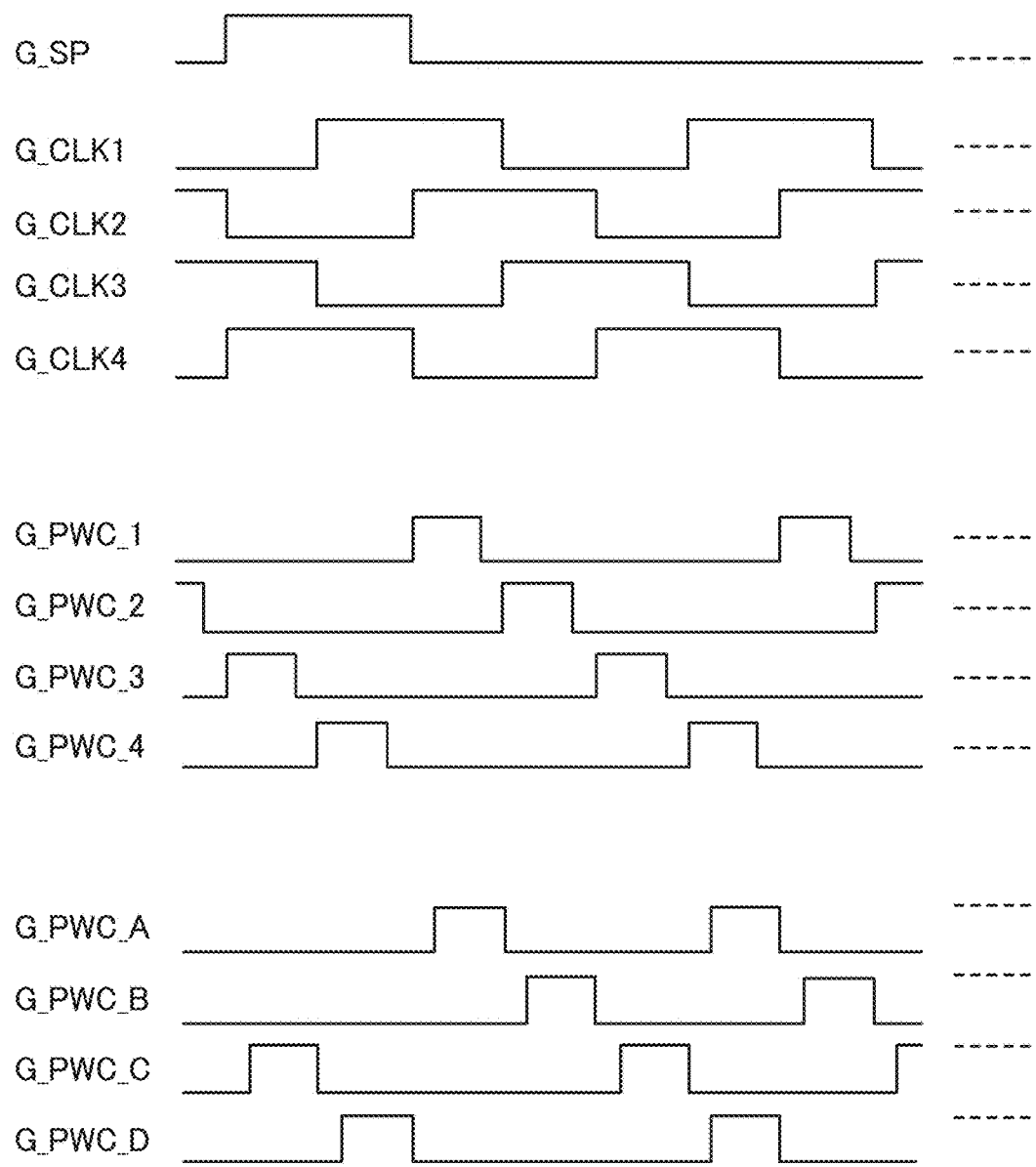
FIG. 29 is a timing chart of a scan line driver circuit according to one embodiment of the present invention.

The scan line driver circuit shown in FIG. 22 can be operated using a timing chart shown in FIG. 29.

<Oxide Semiconductor Film>

An oxide semiconductor film which is one of semiconductor films capable of being used for one embodiment of the present invention is described below.

The oxide semiconductor film is an oxide containing indium. An oxide can have a high carrier mobility (electron mobility) by containing indium, for example. The oxide semiconductor film preferably contains an element M. The element M is aluminum, gallium, yttrium, or tin, for example. The element M is an element having a high bonding energy with oxygen, for example. The element M is an element that can increase the energy gap of the oxide, for example. Further, the oxide semiconductor film preferably contains zinc. When the oxide contains zinc, the oxide is easily to be crystallized, for example. The energy at the top of the valence band of the oxide can be controlled with the atomic ratio of zinc, for example.

Note that the oxide semiconductor film is not limited to the oxide containing indium. The oxide semiconductor film may be a Zn—Sn oxide or a Ga—Sn oxide, for example.

As the oxide semiconductor film, an oxide with a wide energy gap is used. For example, the energy gap of the oxide semiconductor film is greater than or equal to 2.5 eV and less than or equal to 4.2 eV, preferably greater than or equal to 2.8 eV and less than or equal to 3.8 eV, further preferably greater than or equal to 3 eV and less than or equal to 3.5 eV.

In the case where the oxide semiconductor film is formed by a sputtering method, a target containing indium is preferably used in order to reduce the number of particles. In addition, if an oxide target having a high atomic ratio of the element M is used, the conductivity of the target may be decreased. Particularly in the case where a target containing indium is used, the conductivity of the target can be increased and DC discharge or AC discharge is facilitated; thus, deposition over a large substrate can be easily performed. Thus, semiconductor devices can be manufactured with improved productivity.

When the oxide semiconductor film is formed by a sputtering method, the atomic ratio of In to M and Zn contained in the target is preferably 3:1:1, 3:1:2, 3:1:4, 1:1:0.5, 1:1:1, or 1:1:2, for example.

In the case where the oxide semiconductor film is formed by a sputtering method, a film having an atomic ratio deviated from the atomic ratio of the target is formed in some cases. Especially for zinc, the atomic ratio of zinc in a deposited film is smaller than the atomic ratio of the target in some cases. Specifically, the film has an atomic ratio of zinc of 40 atomic % to 90 atomic % of the atomic ratio of zinc in the target.

The influence of impurities in the oxide semiconductor film is described below. In order that the transistor have stable electrical characteristics, it is effective to reduce the concentration of impurities in the oxide semiconductor film so that the oxide semiconductor film has a lower carrier density and is highly purified. The carrier density of the oxide semiconductor film is lower than $1\times10^{17}/cm^3$, lower than $1\times10^{15}/cm^3$, or lower than $1\times10^{13}/cm^3$. In order to reduce the concentration of impurities in the oxide semiconductor film, the concentration of impurities in a film which is adjacent to the oxide semiconductor film is preferably reduced.

For example, silicon contained in the oxide semiconductor film might serve as a carrier trap or a carrier generation source. The concentration of silicon in a region between the oxide semiconductor film and an adjacent insulating film, which is measured by secondary ion mass spectrometry (SIMS), is preferably lower than $1\times10^{19}$ atoms/$cm^3$, more preferably lower than $5\times10^{18}$ atoms/$cm^3$, still more preferably lower than $2\times10^{18}$ atoms/$cm^3$.

Furthermore, when hydrogen is contained in the oxide semiconductor film, the carrier density is increased in some cases. Thus, the concentration of hydrogen in the oxide semiconductor film, which is measured by SIMS, is lower than or equal to $2\times10^{20}$ atoms/$cm^3$, preferably lower than or equal to $5\times10^{19}$ atoms/$cm^3$, further preferably lower than or equal to $1\times10^{19}$ atoms/$cm^3$, still further preferably lower than or equal to $5\times10^{18}$ atoms/$cm^3$. When nitrogen is contained in the oxide semiconductor film, the carrier density is increased in some cases. The concentration of nitrogen in the oxide semiconductor film, which is measured by SIMS, is lower than $5\times10^{19}$ atoms/$cm^3$, preferably lower than or equal to $5\times10^{18}$ atoms/$cm^3$, further preferably lower than or equal to $1\times10^{18}$ atoms/cm$^3$, still further preferably lower than or equal to $5\times10^{17}$ atoms/cm$^3$.

It is preferable to reduce the concentration of hydrogen in the adjacent insulating film in order to reduce the concentration of hydrogen in the oxide semiconductor film. The concentration of hydrogen in the adjacent insulating film measured by SIMS is lower than or equal to $2\times10^{20}$ atoms/cm$^3$, preferably lower than or equal to $5\times10^{19}$ atoms/cm$^3$, further preferably lower than or equal to $1\times10^{19}$ atoms/cm$^3$, still further preferably lower than or equal to $5\times10^{18}$ atoms/cm$^3$. It is preferable to reduce the concentration of nitrogen in the adjacent insulating film in order to reduce the concentration of nitrogen in the oxide semiconductor layer. The concentration of nitrogen in the adjacent insulating film measured by SIMS is lower than $5\times10^{19}$ atoms/cm$^3$, preferably lower than or equal to $5\times10^{18}$ atoms/cm$^3$, more preferably lower than or equal to $1\times10^{18}$ atoms/cm$^3$, still more preferably lower than or equal to $5\times10^{17}$ atoms/cm$^3$.

A structure of the oxide semiconductor film is described below.

An oxide semiconductor film is classified roughly into a single-crystal oxide semiconductor film and a non-single-crystal oxide semiconductor film. The non-single-crystal oxide semiconductor film includes any of a c-axis aligned crystalline oxide semiconductor (CAAC-OS) film, a polycrystalline oxide semiconductor film, a microcrystalline oxide semiconductor film, an amorphous oxide semiconductor film, and the like.

First, a CAAC-OS film is described.

The CAAC-OS film is one of oxide semiconductor films including a plurality of crystal parts, and most of the crystal parts each fit inside a cube whose one side is less than 100 nm. Thus, there is a case where a crystal part included in the CAAC-OS film fits inside a cube whose one side is less than 10 nm, less than 5 nm, or less than 3 nm.

In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

According to the TEM image of the CAAC-OS film observed in a direction substantially parallel to a sample surface (cross-sectional TEM image), metal atoms are arranged in a layered manner in the crystal parts. Each metal atom layer has a morphology reflecting a surface over which the CAAC-OS film is formed (hereinafter, a surface over which the CAAC-OS film is formed is referred to as a formation surface) or a top surface of the CAAC-OS film, and is arranged parallel to the formation surface or the top surface of the CAAC-OS film.

On the other hand, according to the TEM image of the CAAC-OS film observed in a direction substantially perpendicular to the sample surface (plan-view TEM image), metal atoms are arranged in a triangular or hexagonal configuration in the crystal parts. However, there is no regularity of arrangement of metal atoms between different crystal parts.

From the results of the cross-sectional TEM image and the plan-view TEM image, alignment is found in the crystal parts in the CAAC-OS film.

A CAAC-OS film is subjected to structural analysis with an X-ray diffraction (XRD) apparatus. For example, when the CAAC-OS film including an InGaZnO$_4$ crystal is analyzed by an out-of-plane method, a peak appears frequently when the diffraction angle (2θ) is around 31°. This peak is derived from the (009) plane of the InGaZnO$_4$ crystal, which indicates that crystals in the CAAC-OS film have c-axis alignment, and that the c-axes are aligned in a direction substantially perpendicular to the formation surface or the top surface of the CAAC-OS film.

In this specification, the trigonal and rhombohedral crystal systems are included in the hexagonal crystal system.

On the other hand, when the CAAC-OS film is analyzed by an in-plane method in which an X-ray enters a sample in a direction substantially perpendicular to the c-axis, a peak appears frequently when 2θ is around 56°. This peak is derived from the (110) plane of the InGaZnO$_4$ crystal. Here, analysis (φ scan) is performed under conditions where the sample is rotated around a normal vector of a sample surface as an axis (φ axis) with 2θ fixed at around 56°. In the case where the sample is a single-crystal oxide semiconductor film of InGaZnO$_4$, six peaks appear. The six peaks are derived from crystal planes equivalent to the (110) plane. On the other hand, in the case of a CAAC-OS film, a peak is not clearly observed even when φ scan is performed with 2θ fixed at around 56°.

According to the above results, in the CAAC-OS film having c-axis alignment, while the directions of a-axes and b-axes are different between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in a direction parallel to a normal vector of a formation surface or a normal vector of a top surface. Thus, for example, in the case where a shape of the CAAC-OS film is changed by etching or the like, the c-axis might not be necessarily parallel to a normal vector of a formation surface or a normal vector of a top surface of the CAAC-OS film.

Further, the degree of crystallinity in the CAAC-OS film is not necessarily uniform. For example, in the case where crystal growth leading to the CAAC-OS film occurs from the vicinity of the top surface of the film, the degree of the crystallinity in the vicinity of the top surface is higher than that in the vicinity of the formation surface in some cases. Further, when an impurity is added to the CAAC-OS film, the crystallinity in a region to which the impurity is added is changed, and the degree of crystallinity in the CAAC-OS film varies depending on regions.

Note that when the CAAC-OS film with an InGaZnO$_4$ crystal is analyzed by an out-of-plane method, a peak of 2θ may also be observed at around 36°, in addition to the peak of 2θ at around 31°. The peak of 2θ at around 36° indicates that a crystal having no c-axis alignment is included in part of the CAAC-OS film. It is preferable that in the CAAC-OS film, a peak of 2θ appear at around 31° and a peak of 2θ do not appear at around 36°.

The CAAC-OS film is an oxide semiconductor film having low impurity concentration. The impurity is an element other than the main components of the oxide semiconductor film, such as hydrogen, carbon, silicon, or a transition metal element. In particular, an element that has higher bonding strength to oxygen than a metal element included in the oxide semiconductor film, such as silicon, disturbs the atomic arrangement of the oxide semiconductor film by depriving the oxide semiconductor film of oxygen and causes a decrease in crystallinity. Further, a heavy metal such as iron or nickel, argon, carbon dioxide, or the like has a large atomic radius (molecular radius), and thus disturbs the atomic arrangement of the oxide semiconductor film and causes a decrease in crystallinity when it is contained in the oxide semiconductor film. Note that the impurity contained in the oxide semiconductor film might serve as a carrier trap or a carrier generation source.

The CAAC-OS film is an oxide semiconductor film having a low density of defect states. In some cases, oxygen vacancies in the oxide semiconductor film serve as carrier traps or serve as carrier generation sources when hydrogen is captured therein.

The state in which impurity concentration is low and density of defect states is low (the amount of oxygen vacancies is small) is referred to as a "highly purified intrinsic" or "substantially highly purified intrinsic" state. A highly purified intrinsic or substantially highly purified intrinsic oxide semiconductor film has few carrier generation sources, and thus can have a low carrier density. Thus, a transistor including the oxide semiconductor film rarely has negative threshold voltage (is rarely normally on). The highly purified intrinsic or substantially highly purified intrinsic oxide semiconductor film has a low density of defect states, and thus has few carrier traps. Accordingly, the transistor including the oxide semiconductor film has little variation in electrical characteristics and high reliability. Electric charge trapped by the carrier traps in the oxide semiconductor film takes a long time to be released, and might behave like fixed electric charge. Thus, the transistor which includes the oxide semiconductor film having high impurity concentration and a high density of defect states has unstable electrical characteristics in some cases.

With the use of the CAAC-OS film in a transistor, variation in the electrical characteristics of the transistor due to irradiation with visible light or ultraviolet light is small.

Next, a microcrystalline oxide semiconductor film is described.

In an image obtained with the TEM, crystal parts cannot be found clearly in the microcrystalline oxide semiconductor in some cases. In most cases, a crystal part in the microcrystalline oxide semiconductor is greater than or equal to 1 nm and less than or equal to 100 nm, or greater than or equal to 1 nm and less than or equal to 10 nm. A microcrystal with a size greater than or equal to 1 nm and less than or equal to 10 nm, or a size greater than or equal to 1 nm and less than or equal to 3 nm is specifically referred to as nanocrystal (nc). An oxide semiconductor film including nanocrystal is referred to as an nc-OS (nanocrystalline oxide semiconductor) film. In an image obtained with TEM, a crystal grain boundary cannot be found clearly in the nc-OS film in some cases.

In the nc-OS film, a microscopic region (for example, a region with a size greater than or equal to 1 nm and less than or equal to 10 nm, in particular, a region with a size greater than or equal to 1 nm and less than or equal to 3 nm) has a periodic atomic order. Note that there is no regularity of crystal orientation between different crystal parts in the nc-OS film. Thus, the orientation of the whole film is not observed. Accordingly, in some cases, the nc-OS film cannot be distinguished from an amorphous oxide semiconductor film depending on an analysis method. For example, when the nc-OS film is subjected to structural analysis by an out-of-plane method with an XRD apparatus using an X-ray having a diameter larger than that of a crystal part, a peak which shows a crystal plane does not appear. Further, a diffraction pattern like a halo pattern appears in a selected-area electron diffraction pattern of the nc-OS film which is obtained by using an electron beam having a probe diameter (e.g., larger than or equal to 50 nmϕ) larger than the size of a crystal part. Meanwhile, spots are shown in a nanobeam electron diffraction pattern of the nc-OS film obtained by using an electron beam having a probe diameter (e.g., larger than or equal to 1 nm and smaller than or equal to 30 nm) close to, or smaller than or equal to the size of a crystal part. Further, in a nanobeam electron diffraction pattern of the nc-OS film, regions with high luminance in a circular (ring) pattern are observed in some cases. Also in a nanobeam electron diffraction pattern of the nc-OS film, a plurality of spots are shown in a ring-like region in some cases.

The nc-OS film is an oxide semiconductor film that has high regularity as compared to an amorphous oxide semiconductor film. Therefore, the nc-OS film has a lower density of defect states than an amorphous oxide semiconductor film. Note that there is no regularity of crystal orientation between different crystal parts in the nc-OS film. Hence, the nc-OS film has a higher density of defect states than the CAAC-OS film.

Note that an oxide semiconductor film may be a stacked film including two or more films of an amorphous oxide semiconductor film, a microcrystalline oxide semiconductor film, and a CAAC-OS film, for example.

The oxide semiconductor film may be a stack of oxide semiconductor films. For example, the oxide semiconductor film may have a two-layer structure or a three-layer structure.

For example, the case where the oxide semiconductor film has a three-layer structure is described.

For a second layer (middle layer), the description of the above-described oxide semiconductor film is referred to. A first layer (bottom layer) and a third layer (top layer) are each an oxide semiconductor film including one or more elements other than oxygen included in the second layer. Because the first layer and the third layer each include one or more elements other than oxygen included in the second layer, an interface state is less likely to be formed at the interface between the first layer and the second layer and the interface between the second layer and the third layer.

In the case of using an In-M-Zn oxide as the first layer, when summation of In and M is assumed to be 100 atomic %, the proportions of In and M are preferably set to less than 50 atomic % and greater than 50 atomic %, respectively, and more preferably less than 25 atomic % and greater than 75 atomic %, respectively. In the case of using an In-M-Zn oxide as the second layer, when summation of In and M is assumed to be 100 atomic %, the proportions of In and M are preferably set to greater than 25 atomic % and less than 75 atomic %, respectively, and more preferably greater than 34 atomic % and less than 66 atomic %, respectively. In the case of using an In-M-Zn oxide as the third layer, when summation of In and M is assumed to be 100 atomic %, the proportions of In and M are preferably set to less than 50 atomic % and greater than 50 atomic %, respectively, and more preferably less than 25 atomic % and greater than 75 atomic %, respectively. Note that the third layer may be an oxide that is the same type as that of the first layer.

Here, in some cases, there is a mixed region of the first layer and the second layer between the first layer and the second layer. In some cases, there is a mixed region of the second layer and the third layer between the second layer and the third layer. The mixed region has a low density of interface states. For that reason, the stack including the first layer, the second layer, and the third layer has a band structure where energy at each interface is changed continuously (continuous junction).

As the second layer, an oxide having higher electron affinity than those of the first layer and the third layer is used.

For example, as the second layer, an oxide having higher electron affinity than those of the first layer and the third layer by greater than or equal to 0.07 eV and less than or equal to 1.3 eV, preferably greater than or equal to 0.1 eV and less than or equal to 0.7 eV, more preferably greater than or equal to 0.15 eV and less than or equal to 0.4 eV is used. Note that the electron affinity refers to an energy gap between the vacuum level and the bottom of the conduction band.

At this time, when an electric field is applied to the gate electrode, a channel is formed in the second layer having high electron affinity among the first layer, the second layer, and the third layer.

Moreover, the thickness of the third layer is preferably as small as possible to increase the on-state current of the transistor. For example, the thickness of the third layer is less than 10 nm, preferably less than or equal to 5 nm, more preferably less than or equal to 3 nm. Meanwhile, the third layer has a function of blocking elements other than oxygen (such as silicon) included in the adjacent insulating film from entering the second layer where a channel is formed. For this reason, it is preferable that the third layer have a certain thickness. For example, the thickness of the third layer is greater than or equal to 0.3 nm, preferably greater than or equal to 1 nm, more preferably greater than or equal to 2 nm.

To improve reliability, preferably, the thickness of the first layer is large and the thickness of the third layer is small. Specifically, the thickness of the first layer is 20 nm or larger, preferably 30 nm or larger, further preferably 40 nm or larger, still further preferably 60 nm or more. With the first layer having the thickness of 20 nm or larger, preferably 30 nm or larger, further preferably 40 nm or larger, still further preferably 60 nm or larger, the distance from the interface between the adjacent insulating film and the first layer to the second layer where a channel is formed can be 20 nm or larger, preferably 30 nm or larger, further preferably 40 nm or larger, still further preferably 60 nm or larger. To prevent the production efficiency of semiconductor devices from being lowered, the thickness of the first layer is less than or equal to 200 nm, preferably less than or equal to 120 nm, more preferably less than or equal to 80 nm.

For example, the concentration of silicon in a region between the second layer and the first layer measured by SIMS is set to be lower than $1 \times 10^{19}$ atoms/cm$^3$, preferably lower than $5 \times 10^{18}$ atoms/cm$^3$, further preferably lower than $2 \times 10^{18}$ atoms/cm$^3$. The concentration of silicon in a region between the second layer and the third layer, which is measured by SIMS, is set to lower than $1 \times 10^{19}$ atoms/cm$^3$, preferably lower than $5 \times 10^{18}$ atoms/cm$^3$, further preferably lower than $2 \times 10^{18}$ atoms/cm$^3$.

It is preferable to reduce the concentration of hydrogen in each of the first layer and the third layer in order to reduce the concentration of hydrogen in the second layer. The concentration of hydrogen in each of the first layer and the third layer measured by SIMS is set to be lower than or equal to $2 \times 10^{20}$ atoms/cm$^3$, preferably lower than or equal to $5 \times 10^{19}$ atoms/cm$^3$, further preferably lower than or equal to $1 \times 10^{19}$ atoms/cm$^3$, still further preferably lower than or equal to $5 \times 10^{18}$ atoms/cm$^3$. It is preferable to reduce the concentration of nitrogen in each of the first layer and the third layer in order to reduce the concentration of nitrogen in the second layer. The concentration of nitrogen in each of the first layer and the third layer measured by SIMS is set to be lower than $5 \times 10^{19}$ atoms/cm$^3$, preferably lower than or equal to $5 \times 10^{18}$ atoms/cm$^3$, further preferably lower than or equal to $1 \times 10^{18}$ atoms/cm$^3$, still further preferably lower than or equal to $5 \times 10^{17}$ atoms/cm$^3$.

The above-described three-layer structure is an example. For example, a two-layer structure without the first layer or the third layer may be used.

<Module>

A display module using a semiconductor device of one embodiment of the present invention is described below with reference to FIG. 18.

Figure 18:
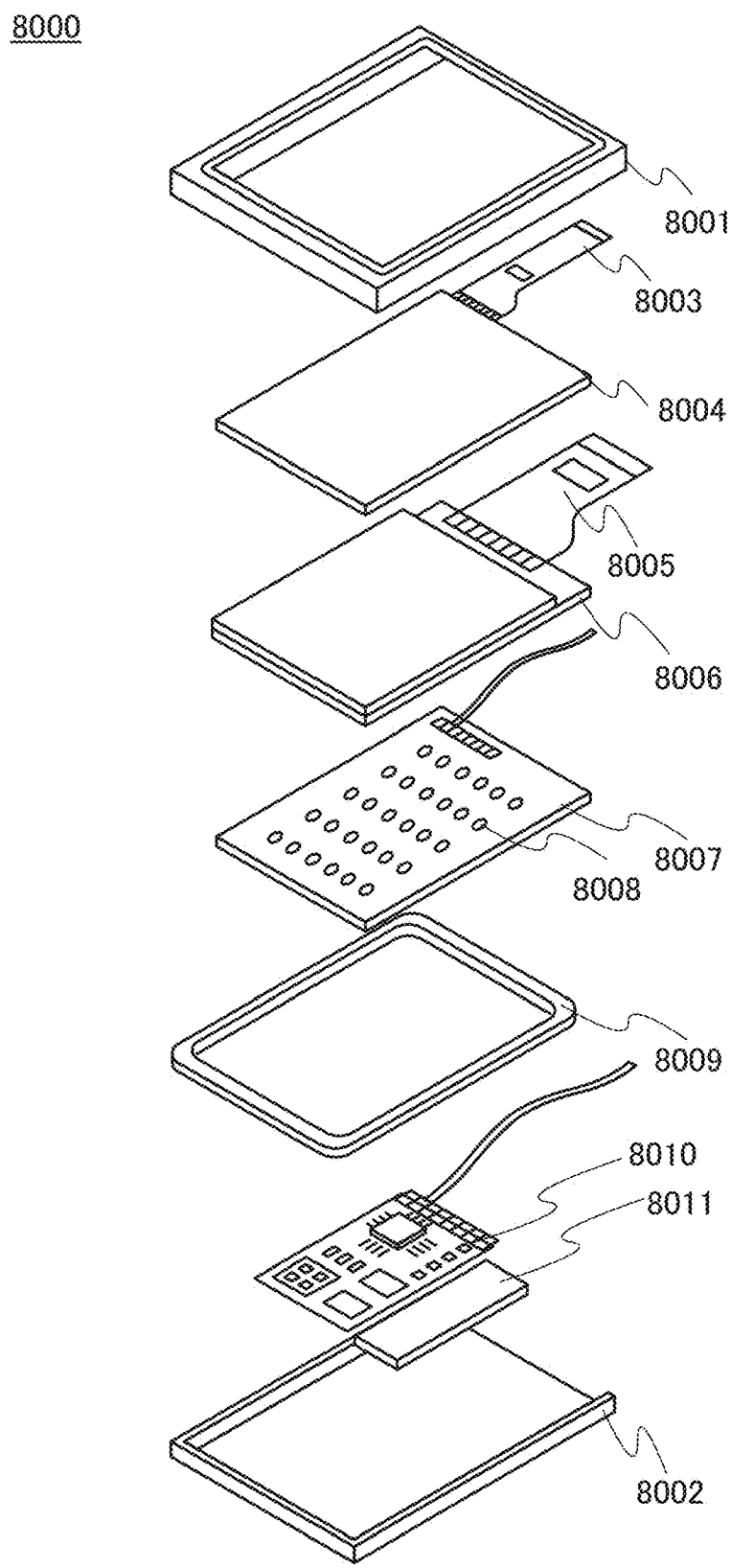
FIG. 18 illustrates a display module according to one embodiment of the present invention.

In a display module 8000 illustrated in FIG. 18, a touch panel 8004 connected to an FPC 8003, a display panel 8006 connected to an FPC 8005, a backlight unit 8007, a frame 8009, a printed board 8010, and a battery 8011 are provided between an upper cover 8001 and a lower cover 8002. Note that the backlight unit 8007, the battery 8011, the touch panel 8004, and the like are not provided in some cases.

The semiconductor device of one embodiment of the present invention can be used for, for example, the display panel 8006.

The shapes and sizes of the upper cover 8001 and the lower cover 8002 can be changed as appropriate in accordance with the sizes of the touch panel 8004 and the display panel 8006.

The touch panel 8004 can be a resistive touch panel or a capacitive touch panel and may be formed so as to overlap with the display panel 8006. A counter substrate (sealing substrate) of the display panel 8006 can have a touch panel function. A photosensor may be provided in each pixel of the display panel 8006 so that an optical touch panel is obtained. An electrode for a touch sensor may be provided in each pixel of the display panel 8006 so that a capacitive touch panel is obtained.

The backlight unit 8007 includes a light source 8008. The light source 8008 may be provided at an end portion of the backlight unit 8007 and a light diffusing plate may be used.

The frame 8009 protects the display panel 8006 and may also function as an electromagnetic shield for blocking electromagnetic waves generated by the operation of the printed board 8010. The frame 8009 can function as a radiator plate.

The printed board 8010 has a power supply circuit and a signal processing circuit for outputting a video signal and a clock signal. As a power source for supplying power to the power supply circuit, an external commercial power source or a power source using the battery 8011 provided separately may be used. The battery 8011 can be omitted in the case of using a commercial power source.

The display module 8000 may be additionally provided with a member such as a polarizing plate, a retardation plate, or a prism sheet.

<Electronic Device>

In this embodiment, examples of an electronic device and a lighting device that include the display device of one embodiment of the present invention are described below with reference to drawings.

As examples of electronic devices including a display device with flexibility, the following can be given: television devices (also called televisions or television receivers), monitors of computers or the like, digital cameras, digital video cameras, digital photo frames, portable information terminals (also called cellular phones or mobile phone devices), portable game machines, portable information terminals, audio reproducing devices, and large game machines such as pachinko machines.

In addition, a lighting device or a display device can be incorporated along a curved inside/outside wall surface of a house or a building or a curved interior/exterior surface of a car.

Figure 19A:
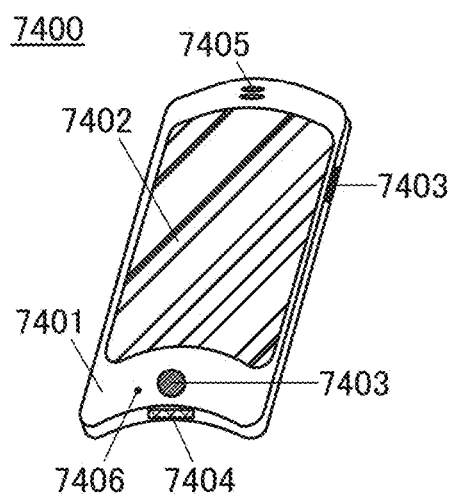
FIGS. 19A to 19D illustrate examples of electronic devices and lighting devices according to one embodiment of the present invention.

FIG. 19A illustrates an example of a portable information terminal. A portable information terminal 7400 is provided with a display portion 7402 incorporated in a housing 7401, an operation button 7403, an external connection port 7404, a speaker 7405, a microphone 7406, and the like. Note that the portable information terminal 7400 is manufactured using the display device in the display portion 7402.

When the display portion 7402 of the portable information terminal 7400 illustrated in FIG. 19A is touched with a finger or the like, data can be input to the portable information terminal 7400. In addition, operations such as making a call and inputting text can be performed by touch on the display portion 7402 with a finger or the like The power can be turned on or off with the operation button 7403. In addition, types of images displayed on the display portion 7402 can be switched: for example, switching images from a mail creation screen to a main menu screen is performed with the operation button 7403.

Here, the display portion 7402 includes the display device of one embodiment of the present invention. Thus, the portable information terminal can have a curved display portion and high reliability.

Figure 19B:
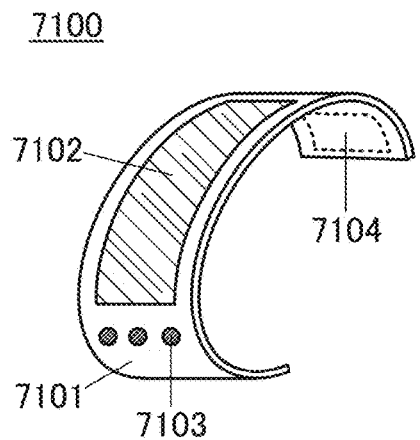

FIG. 19B illustrates an example of a wristband-type display device. A portable display device 7100 includes a housing 7101, a display portion 7102, an operation button 7103, and a sending and receiving device 7104.

The portable display device 7100 can receive a video signal with the sending and receiving device 7104 and can display the received video on the display portion 7102. In addition, with the sending and receiving device 7104, the portable display device 7100 can send an audio signal to another receiving device.

With the operation button 7103, power ON/OFF, switching displayed videos, adjusting volume, and the like can be performed.

Here, the display portion 7102 includes the display device of one embodiment of the present invention. Thus, the mobile display device can have a curved display portion and high reliability.

Figure 19C:
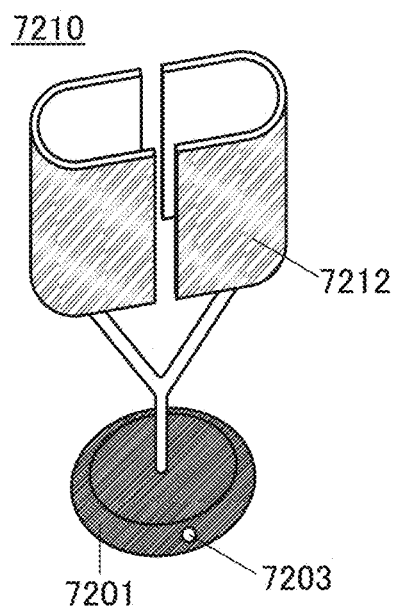
Figure 19D:
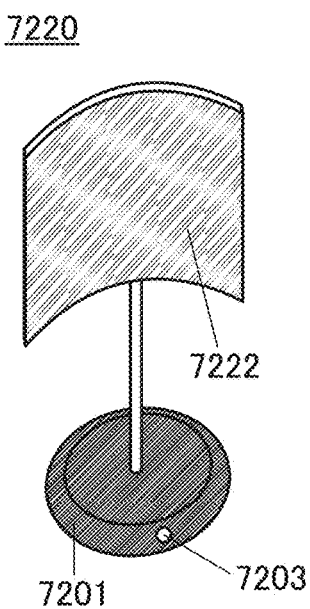

FIGS. 19C and 19D illustrate examples of lighting devices. Lighting devices 7210 and 7220 each include a stage 7201 provided with an operation switch 7203 and a light-emitting portion supported by the stage 7201.

A light-emitting portion 7212 included in the lighting device 7210 illustrated in FIG. 19C has two convex-curved light-emitting portions symmetrically placed. Thus, light radiates from the lighting device 7210.

The lighting device 7220 illustrated in FIG. 19D includes a concave-curved light-emitting portion 7222. This is suitable for illuminating a specific range because light emitted from the light-emitting portion 7222 is collected to the front of the lighting device 7220.

The light-emitting portion included in each of the lighting devices 7210 and 7220 is flexible; thus, the light-emitting portion may be fixed on a plastic member, a movable frame, or the like so that an emission surface of the light-emitting portion can be bent freely depending on the intended use.

The light-emitting portions included in the lighting devices 7210 and 7220 each include the display device of one embodiment of the present invention. Thus, the lighting devices can have curved display portions and high reliability.

Figure 20A:
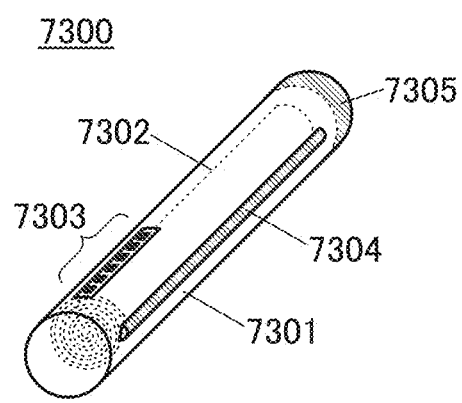
FIGS. 20A and 20B illustrate an example of an electronic device according to one embodiment of the present invention.

FIG. 20A illustrates an example of a portable display device. A display device 7300 includes a housing 7301, a display portion 7302, operation buttons 7303, a display portion pull 7304, and a control portion 7305.

The display device 7300 includes a rolled flexible display portion 7302 in the cylindrical housing 7301. The display portion 7302 includes a first substrate provided with a light-blocking layer and the like and a second substrate provided with a transistor and the like. The display portion 7302 is rolled so that the second substrate is positioned against an inner wall of the housing 7301.

The display device 7300 can receive a video signal with the control portion 7305 and can display the received video on the display portion 7302. In addition, a battery is included in the control portion 7305. Moreover, a connector may be included in the control portion 7305 so that a video signal or power can be supplied directly.

With the operation buttons 7303, power ON/OFF, switching of displayed videos, and the like can be performed.

Figure 20B:
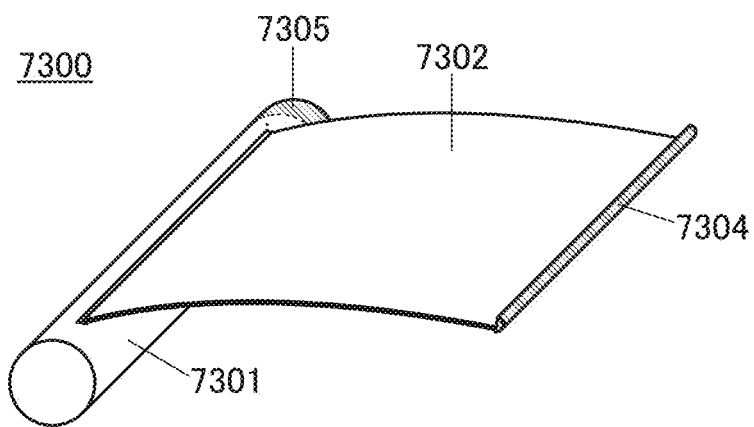

FIG. 20B illustrates a state in which the display portion 7302 is pulled out with the display portion pull 7304. Videos can be displayed on the display portion 7302 in this state. In addition, the operation buttons 7303 on the surface of the housing 7301 allow one-handed operation.

Note that a reinforcement frame may be provided for an edge portion of the display portion 7302 in order to prevent the display portion 7302 from being curved when pulled out.

Note that in addition to this structure, a speaker may be provided for the housing so that sound is output with an audio signal received together with a video signal.

The display portion 7302 includes the display device of one embodiment of the present invention. Thus, the display portion 7302 is a flexible, highly reliable display device, which makes the display device 7300 lightweight and highly reliable.

It is needless to say that the embodiment of the present invention is not limited to the above-described electronic devices and lighting devices as long as the display device of one embodiment of the present invention is included.

The structure, method, and the like described in the embodiment can be used as appropriate in combination with any of the other structures, methods, and the like described in the embodiment.

EXAMPLE 1

In this example, an EL display device according to one embodiment of the present invention was manufactured.

Table 2 shows the specifications of the EL display device.

TABLE 2

| | |
|---|---|
| Screen diagonal | 13.3 inches |
| Driving method | Active matrix |
| Resolution | 7680 × RGB × 4320 (8K × 4K) |
| Pixel density | 664 ppi |
| Pixel pitch | 12.75 mm × RGB × 38.25 mm |
| Aperture ratio | 44.30% |
| Pixel arrangement | RGB stripe |
| Source driver | COF |
| Scan driver | Integrated |
| Number of pixel transistors | 497,664,000 |

The EL display device according to one embodiment of the present invention includes nearly 500 million transistors in a 13.3-inch display area, and has a high aperture ratio of more than 40%.

Note that the EL display device includes the scan line driver circuit illustrated in FIG. 22. The positions of the terminals of the inverter connected to the wiring G2 and the terminals of the inverter connected to the wiring G3 are the same as those shown in FIGS. 23A to 23C. Note that the shift register illustrated in FIG. 26 was used as a shift register of the scan line driver circuit.

Figure 30:
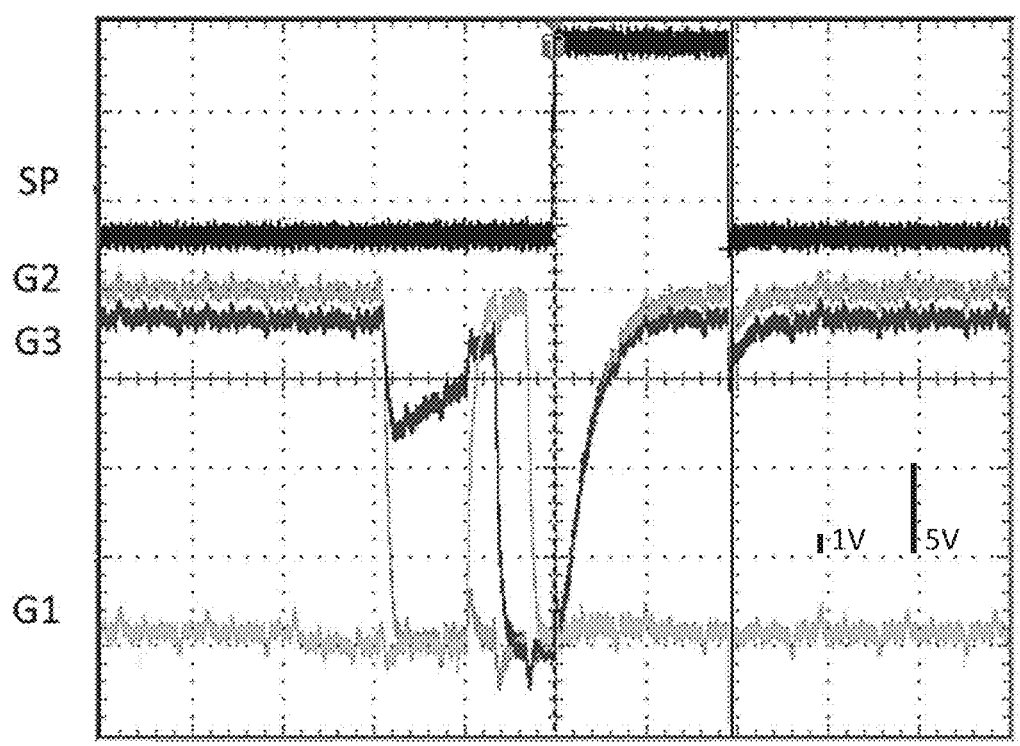
FIG. 30 shows output waveforms of a scan line driver circuit according to one embodiment of the present invention.

FIG. 30 shows output waveforms of the scan line driver circuit. The clock (GCK1) frequency is 64.8 kHz. The amplitude voltage of the output signal of the wiring G1 was approximately 20 V. That is, in the EL display device manufactured in this example, the wiring G1 can be charged enough even with a short selection period.

Figure 21:
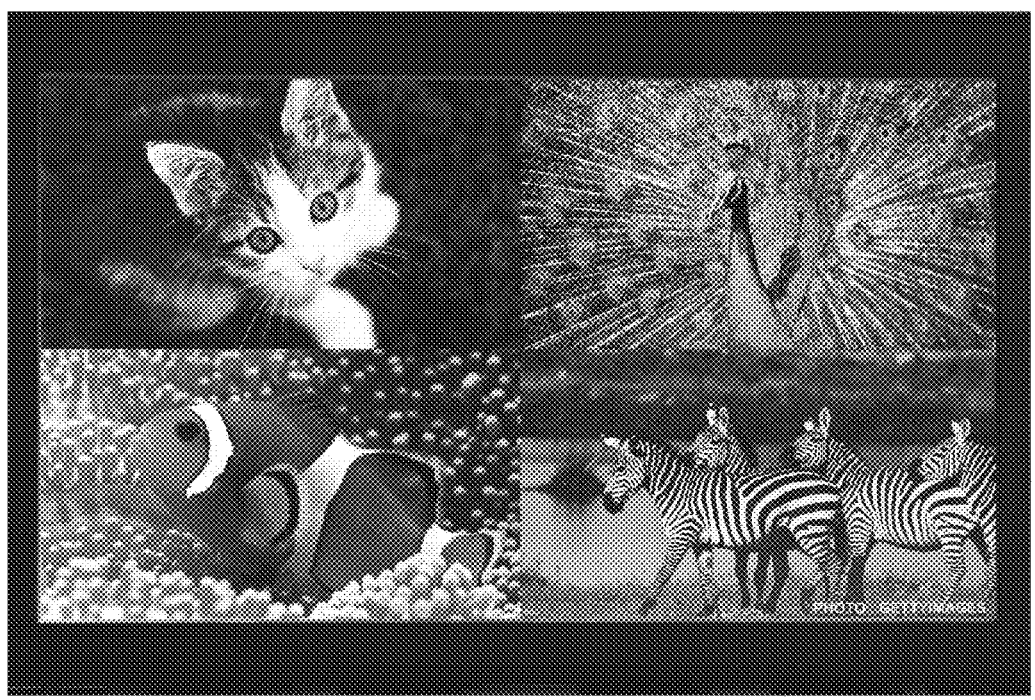
FIG. 21 is a photograph of a display device according to one embodiment of the present invention.
Figure 31:
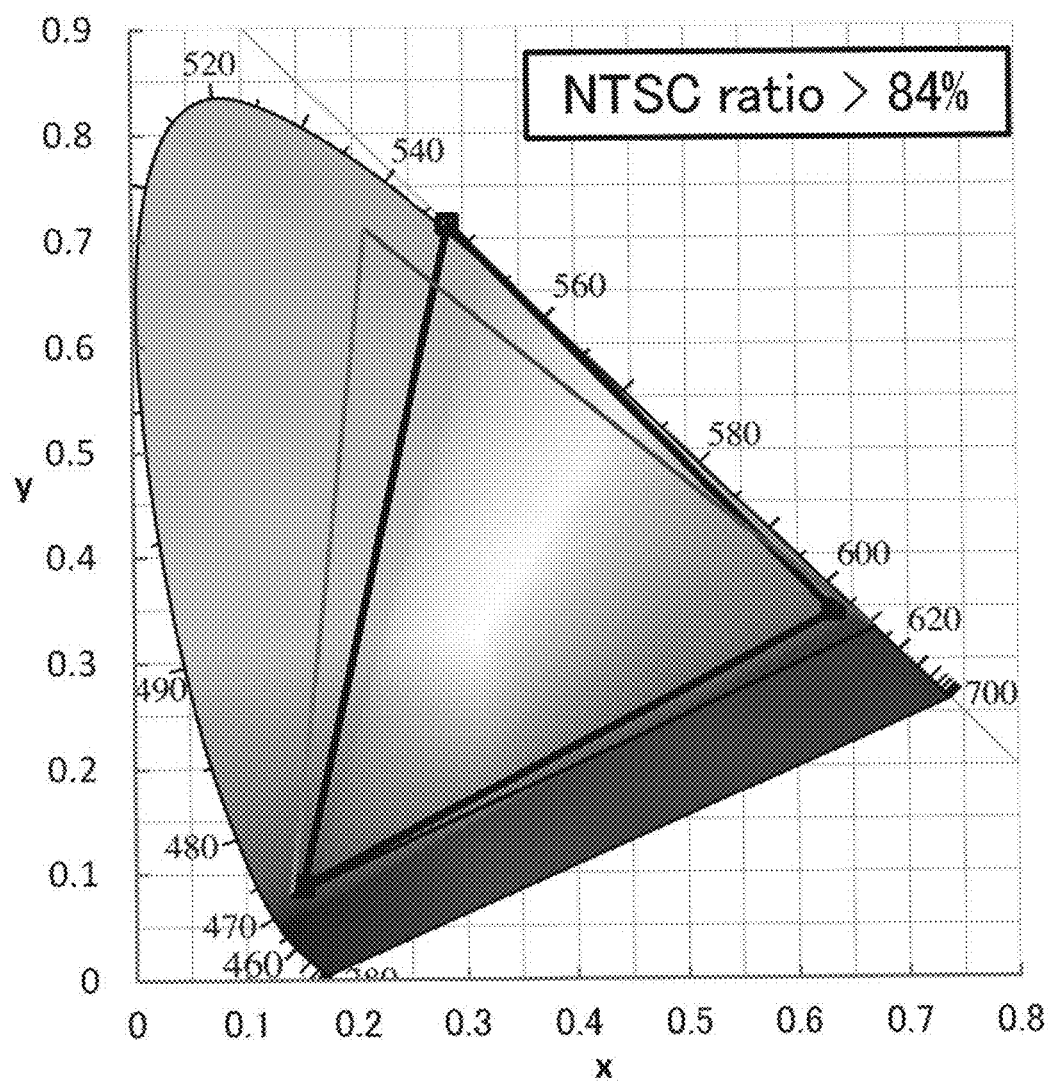
FIG. 31 shows a chromaticity coordinate of each color of R, G, and B in a display device according to one embodiment of the present invention.

FIG. 21 is a photograph of the EL display device. FIG. 31 shows the chromaticity coordinate of each color of R, G, and B of the EL display device. As in FIG. 31, the NTSC ratio of this EL display device is higher than 84%. FIGS. 21 and 31 show that the EL display device manufactured in this example has high display quality despite high density of elements.

This application is based on Japanese Patent Application serial no. 2013-184153 filed with Japan Patent Office on Sep. 5, 2013, Japanese Patent Application serial no. 2014-107131 filed with Japan Patent Office on May 23, 2014, and Japanese Patent Application serial no. 2014-134727 filed with Japan Patent Office on Jun. 30, 2014, the entire contents of which are hereby incorporated by reference.

What is claimed is:

1. A semiconductor device comprising:
   a first conductive film and a second conductive film over an insulating surface;
   a first insulating film including a first region and a second region, over the first conductive film and the second conductive film;
   a semiconductor film over the first insulating film, the semiconductor film overlapping with the first conductive film;
   a third conductive film electrically connected to the semiconductor film;
   a fourth conductive film electrically connected to the semiconductor film, the fourth conductive film overlapping with the second conductive film;
   a second insulating film over the semiconductor film, the third conductive film, and the fourth conductive film; and
   a fifth conductive film over the second insulating film, the fifth conductive film overlapping with the fourth conductive film,
   wherein the fourth conductive film is configured to serve as one electrode of a capacitor,
   wherein the fifth conductive film is configured to serve as another electrode of the capacitor,
   wherein a thickness of the second region is smaller than a thickness of the first region,
   wherein bottom surfaces of the first region and the second region are in direct contact with a top surface of the second conductive film, and
   wherein the bottom surfaces of the first region and the second region are in the same plane of the first insulating film.

2. The semiconductor device according to claim 1, wherein the semiconductor film is an oxide semiconductor film.

3. The semiconductor device according to claim 1, wherein the semiconductor film is a polycrystalline silicon film.

4. The semiconductor device according to claim 1, further comprising a sixth conductive film over the second insulating film,
   wherein the sixth conductive film overlaps with the semiconductor film.

5. The semiconductor device according to claim 1, further comprising:
   a third insulating film over the second insulating film and the fifth conductive film; and
   a display element over the third insulating film,
   wherein the display element is electrically connected to the fourth conductive film.

6. The semiconductor device according to claim 1, wherein the second conductive film is electrically connected to the fifth conductive film.

7. A semiconductor device comprising:
   a first conductive film and a second conductive film over an insulating surface;
   a first insulating film including a first region and a second region, over the first conductive film and the second conductive film;
   a semiconductor film over the first insulating film, the semiconductor film overlapping with the first conductive film;
   a third conductive film electrically connected to the semiconductor film;
   a fourth conductive film electrically connected to the semiconductor film, the fourth conductive film overlapping with the second conductive film;
   a second insulating film including a third region and a fourth region, over the semiconductor film, the third conductive film, and the fourth conductive film; and
   a fifth conductive film over the fourth region, the fifth conductive film overlapping with the fourth conductive film,
   wherein the fourth conductive film is configured to serve as one electrode of a capacitor,
   wherein the fifth conductive film is configured to serve as another electrode of the capacitor,
   wherein a thickness of the second region is smaller than a thickness of the first region,
   wherein a thickness of the fourth region is smaller than a thickness of the third region,
   wherein bottom surfaces of the first region and the second region are in direct contact with a top surface of the second conductive film, and
   wherein the bottom surfaces of the first region and the second region are in the same plane of the first insulating film.

8. The semiconductor device according to claim 7, wherein the semiconductor film is an oxide semiconductor film.

9. The semiconductor device according to claim 7, wherein the semiconductor film is a polycrystalline silicon film.

10. The semiconductor device according to claim 7, further comprising a sixth conductive film over the second insulating film,
    wherein the sixth conductive film overlaps with the semiconductor film.

11. The semiconductor device according to claim 7, further comprising:
    a third insulating film over the second insulating film and the fifth conductive film; and
    a display element over the third insulating film,
    wherein the display element is electrically connected to the fourth conductive film.

12. The semiconductor device according to claim 7, wherein the second conductive film is electrically connected to the fifth conductive film.

13. A semiconductor device comprising:
   a transistor comprising:
      a first conductive film over an insulating surface;
      a first insulating film over the first conductive film;
      a semiconductor film over the first insulating film;
      a second conductive film electrically connected to the semiconductor film;
      a third conductive film electrically connected to the semiconductor film; and
      a second insulating film over the semiconductor film, the second conductive film and the third conductive film, and
   a capacitor comprising:
      a fourth conductive film;
      the first insulating film over the fourth conductive film;
      the third conductive film over the first insulating film;
      the second insulating film over the third conductive film; and
      a fifth conductive film over the second insulating film,
   wherein the first insulating film comprises a first region and a second region,
   wherein bottom surfaces of the first region and the second region are in direct contact with a top surface of the fourth conductive film,
   wherein the bottom surfaces of the first region and the second region are in the same plane of the first insulating film, and
   wherein a thickness of the second region is smaller than a thickness of the first region.

14. The semiconductor device according to claim 13, wherein the semiconductor film is an oxide semiconductor film.

15. The semiconductor device according to claim 13, wherein the semiconductor film is a polycrystalline silicon film.

16. The semiconductor device according to claim 13, further comprising a sixth conductive film over the second insulating film,
   wherein the sixth conductive film overlaps with the semiconductor film.

17. The semiconductor device according to claim 13, further comprising:
   a third insulating film over the second insulating film and the fifth conductive film; and
   a display element over the third insulating film,
   wherein the display element is electrically connected to the third conductive film.

* * * * *